United States Patent
Rouh et al.

(10) Patent No.: US 7,365,406 B2
(45) Date of Patent: *Apr. 29, 2008

(54) NON-UNIFORM ION IMPLANTATION APPARATUS AND METHOD THEREOF

(75) Inventors: Kyoung Bong Rouh, Goyang-si (KR); Seung Woo Jin, Icheon-si (KR); Min Yong Lee, Seoul (KR)

(73) Assignee: Hynix Semiconductor Inc., Icheon-shi (KR)

( * ) Notice: Subject to any disclaimer, the term of this patent is extended or adjusted under 35 U.S.C. 154(b) by 25 days.

This patent is subject to a terminal disclaimer.

(21) Appl. No.: 11/305,790

(22) Filed: Dec. 16, 2005

(65) Prior Publication Data

US 2006/0252217 A1    Nov. 9, 2006

(30) Foreign Application Priority Data

May 4, 2005 (KR) .................. 10-2005-0037641

(51) Int. Cl.
H01L 27/14 (2006.01)
H01L 31/00 (2006.01)

(52) U.S. Cl. ............... 257/428; 257/659; 257/E21.134; 257/E21; 257/334; 257/E21.347

(58) Field of Classification Search ........... 257/428, 257/219, 421, 429, 430, 431, 607, 659
See application file for complete search history.

(56) References Cited

U.S. PATENT DOCUMENTS 4,855,604 A    8/1989   Riahi
6,297,510 B1 * 10/2001  Farley ................ 250/492.21
6,313,475 B1 * 11/2001  Renau et al. ......... 250/492.21
6,573,517 B1 *  6/2003  Sugitani et al. ...... 250/492.21
6,870,170 B1    3/2005  Farley et al.
6,956,325 B2 * 10/2005  Yamazaki et al. ........ 313/512
2007/0023696 A1 * 2/2007  Lee ................... 250/492.21

FOREIGN PATENT DOCUMENTS

| JP | 2199758       | 8/1990 |
| JP | 04-092349 A   | 3/1992 |
| JP | 2001-512904 A | 8/2001 |
| JP | 2003-132835 A | 5/2003 |

(Continued)

*Primary Examiner*—David Nhu
(74) *Attorney, Agent, or Firm*—Townsend and Townsend and Crew LLP

(57) ABSTRACT

A non-uniform ion implantation apparatus comprises a wide ion beam generator configured to generate a plurality of wide ion beams to irradiate at least two regions on the entire area of a wafer, and a wafer rotating device configured to rotate the wafer in a predetermined direction while the wide ion beams generated by the wide ion beam generator are irradiated to the wafer. Among the wide ion beams, at least one wide ion beam has a different dose from that of at least one different wide ion beam. Since the wide ion beams are irradiated at different doses to the wafer, a smooth circular border is formed between the regions to which the impurity ions are implanted to different concentrations. Since the position of the wafer is suitably changed for the wide ion beams, it is possible to control disposition of the regions implanted with the impurity ions of different concentrations.

15 Claims, 16 Drawing Sheets

FOREIGN PATENT DOCUMENTS

| | | |
|---|---|---|
| JP | 2003-178995 A | 6/2003 |
| KR | 10-1995-0030218 | 11/1995 |
| KR | 10-2000-0073648 A | 5/2000 |
| KR | 10-2001-0036042 A | 5/2001 |
| TW | 558755 B | 10/2003 |

* cited by examiner

NON-UNIFORM ION IMPLANTATION APPARATUS AND METHOD THEREOF

CROSS-REFERENCES TO RELATED APPLICATIONS

The present application claims priority to Korean Patent Application No. 10-2005-0037641, filed on May 4, 2005, which is incorporated by reference.

BACKGROUND OF THE INVENTION

The present invention relates to apparatuses and methods for manufacturing a semiconductor, and more particularly, to non-uniform ion implantation apparatuses and methods, which enable impurity ions to be implanted at different doses in different regions of a wafer.

Generally, when manufacturing semiconductor devices such as Dynamic Random Access Memories (DRAMs), many processes are required. The these processes include a deposition process, an etching process, an ion implantation process, etc., and are typically performed for each wafer. Among these processes, the ion implantation process is a process performed in a way of accelerating dopant ions such as boron, arsenic ions, and the like using a strong electric field to pass through the surface of the wafer, thereby changing electric properties of the material through the ion implantation.

FIG. 1 is a schematic view illustrating a conventional ion implantation apparatus for this process.

Referring to FIG. 1, the conventional ion implantation apparatus includes a quadrupole magnet assembly 110, an X-scanner 120, a beam balancer 130, and an accelerator 140. More specifically, the quadrupole magnet assembly 110 serves to expand and reduce an ion beam 102 delivered from an ion beam source (not shown), and includes quadrupole magnets to generate a magnetic field in a gap between four magnetic poles. The quadrupole magnet assembly 110 includes first and second magnet assemblies 111 and 112, each having two S-poles and two N-poles. The X-scanner 120 scans the ion beam 102 in an X direction in order to uniformly distribute the ion beam 102 on a wafer 101. The beam balancer 130 serves to equate a parallel optical path in reference to ion beam 102. The accelerator 140 serves to accelerate charged particles, and can be positioned in front of the X-scanner 120 in some cases without being limited to a particular position, as shown in FIG. 1. With the conventional ion implantation apparatus described above, the ion beam 102 is scanned over the surface of the wafer 101 in the X direction, and at this time, the wafer 101 is moved in a Y direction in order to ensure ion implantation on the entire surface of the wafer 101.

FIG. 2 is a view illustrating a device for scanning the wafer 101 in the Y direction.

Referring to FIG. 2, a table (not shown) to support the wafer 101 is connected to a Y-driving shaft 210, which is connected to a driving unit 220. Operation of the driving unit 220 causes the Y-driving shaft 210 to move in the Y direction, as shown in arrow 211 of FIG. 2. While the wafer 101 moves in the Y direction, the ion beam 102 is scanned over the wafer 101 in the X direction. During this process, first and second wide ion beam detectors 231 and 232 respectively positioned in front and rear of the wafer 101 detect a dose of the implanted impurity ions, and supply information for controlling the dose of the impurity ions.

However, if the ion implantation is performed using the conventional ion implantation apparatus as described above, the impurity ions are implanted with near uniform concentration over the entirety of the wafer 101. In terms of the ion implantation only, this result is desirable, but when considered in relation to other unit processes, this result can be undesirable. In other words, after performing various unit processes, it can be easily found that these unit processes should not be uniformly performed over the entirety of the wafer, causing undesirable results, such as an undesired thickness of layers deposited on the wafer, an undesired etching rate, and the like. This is attributed to the fact that various parameters of each unit process cannot be accurately controlled. Thus, it is the actual circumstance in the art that fabrication errors may be provided due to unexpected or inaccurately controlled parameters during the process.

For example, when forming a gate electrode, a critical dimension ("CD") indicating the width of the gate electrode can be varied depending on positions on the wafer. For example, the gate electrode can have a higher CD at a central region of the wafer, and a lower CD at the periphery of the wafer, or vice versa. As described above, the variation in thickness as described above is caused by inaccurate control of the various parameters of the unit processes. As such, if the CD of the gate electrode is higher at the central region of the wafer than at the periphery of the wafer, the threshold voltage of the device is also higher at the central region of the wafer than at the periphery of the wafer. If the CD of the gate electrode is lower at the central region of the wafer than at the periphery of the wafer, the threshold voltage of the device is lower at the central region of the wafer than at the periphery of the wafer.

A difference in CD of the gate electrode depending on the position on the wafer results in certain issues as an integration degree of devices on the wafer is increased. For example, when a minimally acceptable CD of the gate electrode is 200 nm, a reduction in yield is not significant even if ±10% distribution of CD is determined to be defective. However, when the minimally acceptable CD of the gate electrode is 100 nm, the reduction in yield becomes significant if ±10% distribution of CD is determined to be defective. Thus, when the minimally acceptable CD of the gate electrode is 100 nm, the distribution of CD as a reference for determination of defective items should be determined within a narrower range, for example, ±5%, and even in this case, the reduction in yield may still be significant due to the decrease in fabrication margin.

Thus, instead of accepting the difference in CD of the gate electrode on the wafer due to restriction of the unit processes, a non-uniform ion implantation method has recently been suggested wherein non-uniform implantation of impurity ions for compensation of the difference provides uniform characteristics over the entirety of the wafer. As described above, when the CD of the gate electrode is higher at the central region of the wafer than at the periphery of the wafer, the threshold voltage of the device is also higher at the central region of the wafer than at the periphery of the wafer. In this case, with the non-uniform ion implantation method, the impurity ions are implanted to a higher concentration at the central region of the wafer, and are implanted to a lower concentration at the periphery of the wafer in order to provide uniform characteristics over the entire surface of the wafer. On the contrary, when the CD of the gate electrode is lower at the central region of the wafer than at the periphery of the wafer, the threshold voltage of the device is lower at the central region of the wafer than at the periphery of the wafer. In this case, with the non-uniform ion implantation method, the impurity ions are implanted to a lower concentration at the central region of the wafer, and are implanted to a higher concentration at the periphery of the wafer in order to provide uniform characteristics over the entirety of the wafer. However, most of the conventional non-uniform ion implantation methods have difficulties in that a border between the region to be doped to a higher concentration and a region to be doped to a lower concentration is unclearly formed, and thus, they cannot be easily applied to actual processes.

BRIEF SUMMARY OF THE INVENTION

Embodiments in accordance with the present invention provide a non-uniform ion implantation apparatus, which can implant impurity ions to different concentrations at respective regions of a wafer to provide uniform characteristics over the entirety of the wafer, and to form a clear and smooth border between a region to be implanted to a higher concentration and a region to be implanted to a lower concentration.

Embodiments in accordance with the present invention also provide a non-uniform ion implantation method of implanting impurity ions to different concentrations at respective regions of a wafer to provide uniform characteristics over the entirety of the wafer, and forming a clear and smooth border between a region to be implanted to a higher concentration and a region to be implanted to a lower concentration.

In accordance with one aspect of the present invention, the embodiments can be accomplished by the provision of a non-uniform ion implantation apparatus, comprising: a wide ion beam generator configured to generate a plurality of wide ion beams to irradiate at least two regions on a wafer; and a wafer rotating device configured to rotate the wafer in a predetermined direction while the wide ion beams generated by the wide ion beam generator are irradiated to the wafer.

In accordance with one aspect of the present invention, at least one wide ion beam among a plurality of wide ion beams may have a different dose from that of at least one different wide ion beam.

In accordance with another aspect of the present invention, a non-uniform ion implantation apparatus comprises: a wide ion beam generator configured to generate a plurality of wide ion beams comprising first and second wide ion beams to irradiate first and second regions of a wafer, respectively; and a wafer rotating device configured to rotate the wafer in a predetermined direction while the wide ion beams generated by the wide ion beam generator is irradiated to the wafer. The first and second wide ion beams may have different doses.

In one embodiment of the present invention, the first and second regions may occupy half of an entire area of the wafer. In this embodiment, the first and second regions may be divided by a border in a vertical direction. Furthermore, the first region may be adjacent to a periphery of the wafer with respect to the border, and the second region may be adjacent to a central region of the wafer with respect to the border.

In another embodiment of the present invention, the first and second regions may occupy the entire area of the wafer. In this embodiment, the first and second regions may be divided by first and second borders in a vertical direction. Furthermore, the first region may be adjacent to the periphery of the wafer with respect to the first and second borders, and the second region may be adjacent to the central region of the wafer with respect to the first and second borders.

In accordance with yet another aspect of the present invention, a non-uniform ion implantation apparatus comprises: a wide ion beam generator including first and second magnetrons configured to generate wide ion beams to irradiate the region of a wafer between the first and second magnetrons, the first magnetron including a series of first unit magnetrons, the second magnetron including a series of second unit magnetrons facing and being spaced a predetermined distance from the first unit magnetrons, respectively; and a wafer rotating device configured to rotate the wafer in a predetermined direction while the wide ion beams generated by the wide ion beam generator are irradiated to the wafer.

In one embodiment of the present invention, the series of first unit magnetrons may include a first group of first unit magnetrons to which a first bias is applied, and a second group of first unit magnetrons to which a second bias different from the first bias is applied, and the series of second unit magnetron may include a first group of second unit magnetrons to which the first bias is applied, and a second group of second unit magnetrons to which the second bias is applied to.

In this embodiment, the first group of first unit magnetrons may face the first group of second unit magnetrons such that a first wide ion beam having a first dose is generated between the first group of first unit magnetrons and the first group of second unit magnetrons, and the second group of first unit magnetrons may face the second group of second unit magnetrons such that a second wide ion beam having a second dose different from the first dose is generated between the second group of first unit magnetrons and the second group of second unit magnetrons.

In another embodiment of the present invention, the series of first unit magnetrons may include first and second groups of first unit magnetrons separated from each other and to which a first bias is applied, and a third group of first unit magnetrons disposed between the first and second groups of first unit magnetrons and to which a second bias different from the first bias is applied.

In this embodiment, the first and second groups of first unit magnetrons may face the first and second groups of second unit magnetrons such that a first wide ion beam having a first dose is generated between the first and second groups of first unit magnetrons and the first and second groups of second unit magnetrons, respectively, and the third group of first unit magnetrons may face the third group of second unit magnetrons such that a second wide ion beam having a second dose different from the first dose is generated between the third group of first unit magnetrons and the third group of second unit magnetrons.

In accordance with yet another aspect of the present invention, a non-uniform ion implantation method comprises: irradiating a plurality of wide ion beams to a wafer, the plurality of wide ion beams comprising first and second wide ion beams having first and second doses, respectively; and rotating the wafer in a predetermined direction while the wide ion beams are irradiated to the wafer.

In one embodiment of the present invention, the method may further comprise positioning the wafer such that the wide ion beams irradiate up to half of the entire area of the wafer.

In this embodiment, the first wide ion beam may irradiate a region adjacent to a periphery of the wafer, and the second wide ion beam may irradiate a region adjacent to a central region of the wafer.

The method may further comprise moving the wafer by a predetermined distance vertically or horizontally from an initial position.

In one embodiment of the present invention, the first ion beam may be split into two sections at both sides of the second wide ion beam. In this embodiment, the method may further comprise positioning the wafer such that the wide ion beams irradiate the entire area of the wafer. Furthermore, the first wide ion beam may irradiate a region adjacent to either side of the wafer, and the second wide beam may irradiate a region adjacent to the central region of the wafer.

The method may further comprise moving the wafer by a predetermined distance vertically or horizontally from an initial position. The wafer may be rotated at a rotational speed of about 20 to 1,500 rpm. The wafer may be rotated a plurality of times.

In accordance with yet another aspect of the present invention, a non-uniform ion implantation method may comprise: irradiating a plurality of wide ion beams to a wafer, the plurality of wide ion beams having different doses; and rotating the wafer in a predetermined direction while the wide ion beams are irradiated to the wafer.

BRIEF DESCRIPTION OF THE DRAWINGS

The foregoing embodiments and features of the present invention will be more clearly understood from the following detailed description taken in conjunction with the accompanying drawings, in which.

DETAILED DESCRIPTION OF THE INVENTION

Embodiments in accordance with the present invention will be described in detail with reference to the accompanying drawings. It should be noted that various modifications and alteration can be made to the embodiments of the present invention, and thus the scope of the present invention is not limited to the embodiments described below.

Figure 1:
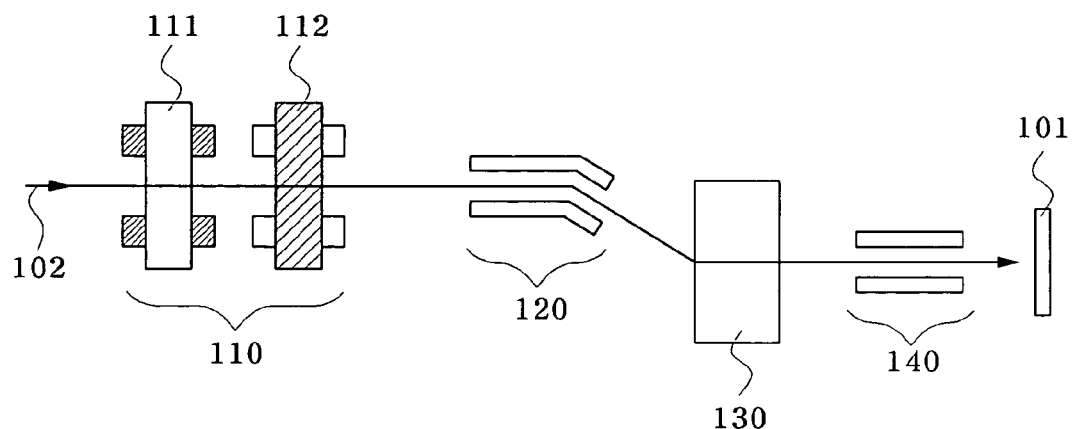
FIG. 1 is a schematic view illustrating a conventional ion implantation apparatus.
Figure 2:
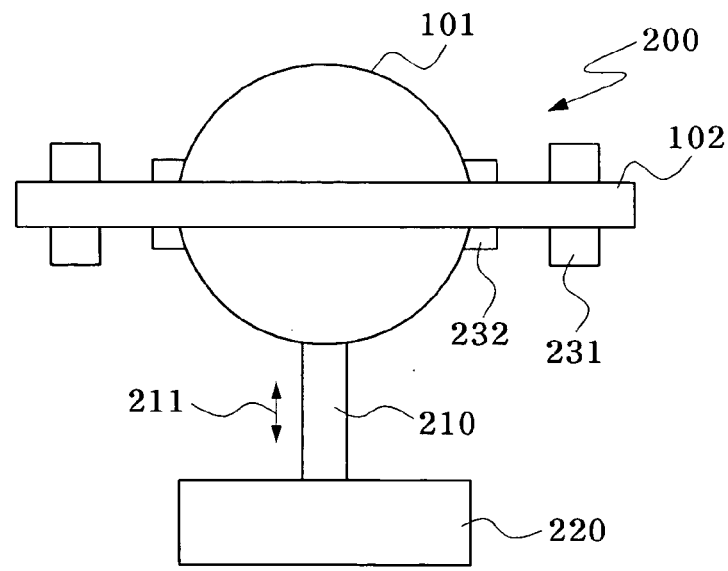
FIG. 2 is a view illustrating a device for scanning a wafer of FIG. 1 in a Y direction.
Figure 3:
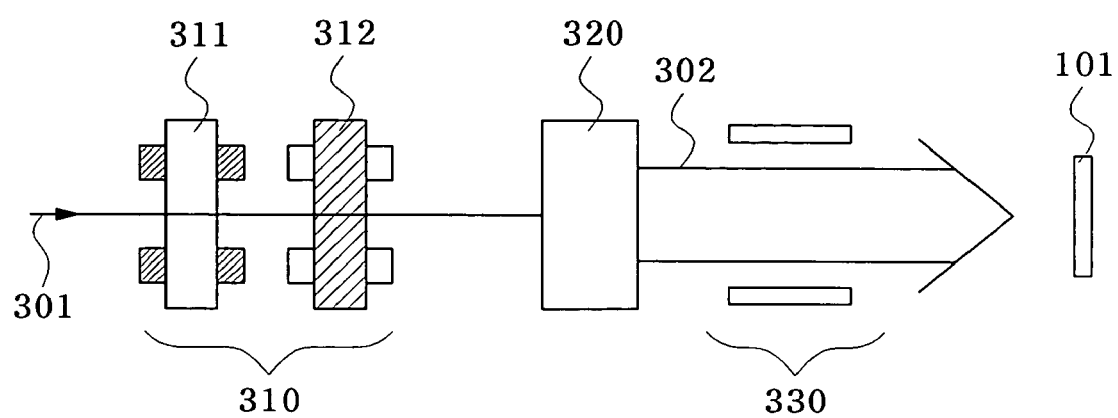
FIG. 3 is a schematic view illustrating a non-uniform ion implantation apparatus in accordance with one embodiment of the present invention.

FIG. 3 is a schematic view illustrating a non-uniform ion implantation apparatus in accordance with one embodiment of the present invention.

Referring to FIG. 3, the ion implantation apparatus of the invention includes a quadrupole magnet assembly 310 to expand and reduce ion beams 301 delivered from an ion beam source, a wide ion beam generator 320 to convert the ion beams delivered from the quadrupole magnet assembly 310 into wide ion beams 302 and then emit the wide ion beams 302, and an accelerator 330 to accelerate charged particles. In addition, although not shown in FIG. 3, the apparatus further includes a wafer rotating device configured to rotate a wafer 101 at a predetermined speed, for example, about 20 to 1,500 rpm.

The quadrupole magnet assembly 310 includes quadrupole magnets to generate a magnetic field in a gap between four magnetic poles. More specifically, the quadrupole magnet assembly 310 includes first and second magnet assemblies 311 and 312, each having two S-poles and two N-poles.

The wide ion beam generator 320 serves to convert the ion beams emitted from the quadrupole magnet assembly 310 into the wide ion beams 302. Since the wide ion beam generator 320 includes multi-pole magnetrons, wide ion beam generator 320 can vary the concentration of impurity ions according to respective regions. Detailed description of the wide ion beam generator 320 will be set forth below.

The accelerator 330 serves to accelerate the charged particles. The accelerator 330 can be positioned in front of the wide ion beam generator 320 in some cases without being limited to a particular position, as shown in FIG. 3.

Figure 4:
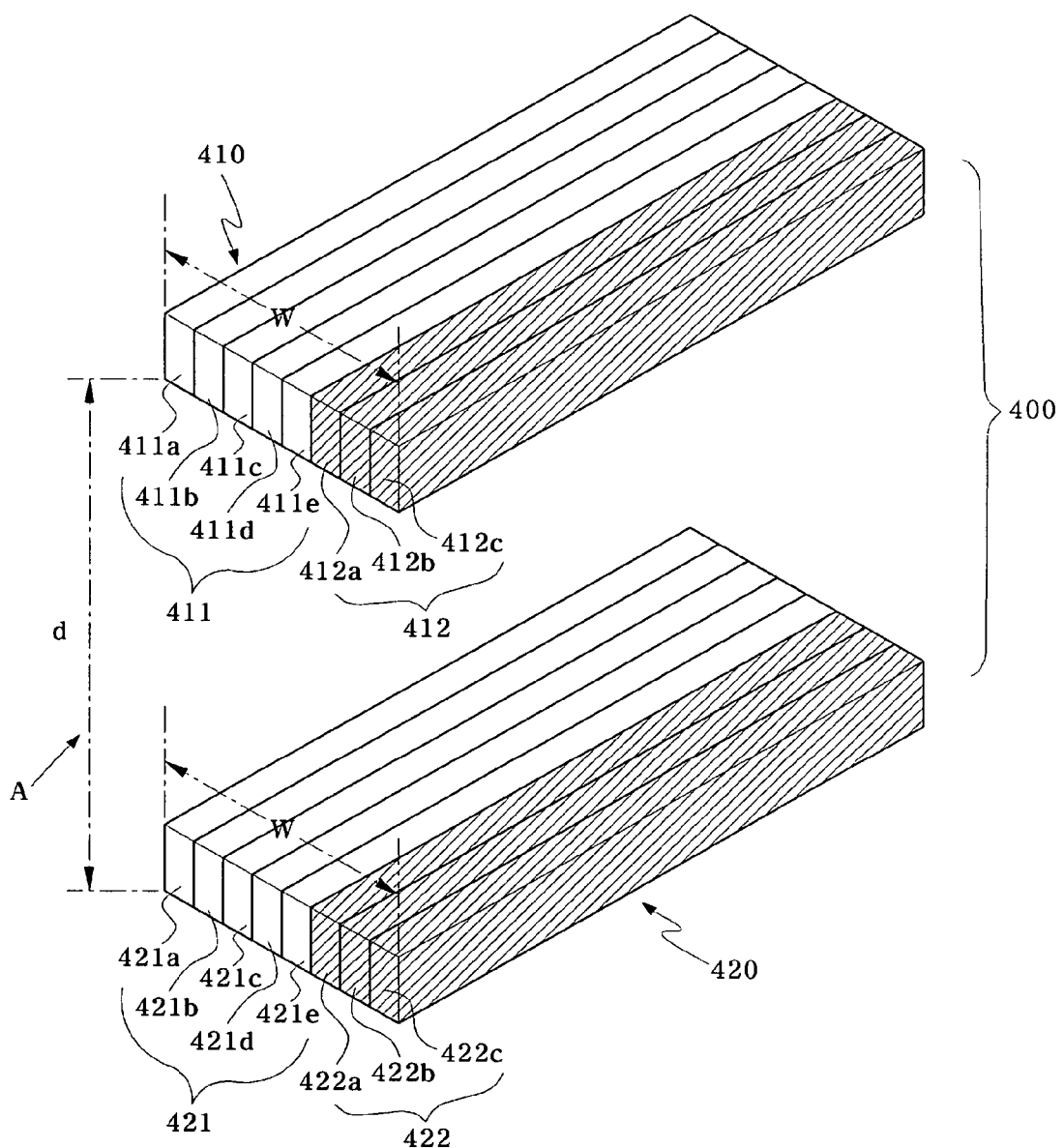
FIG. 4 is a view illustrating one example of a wide ion beam generator of FIG. 3.
Figure 5:
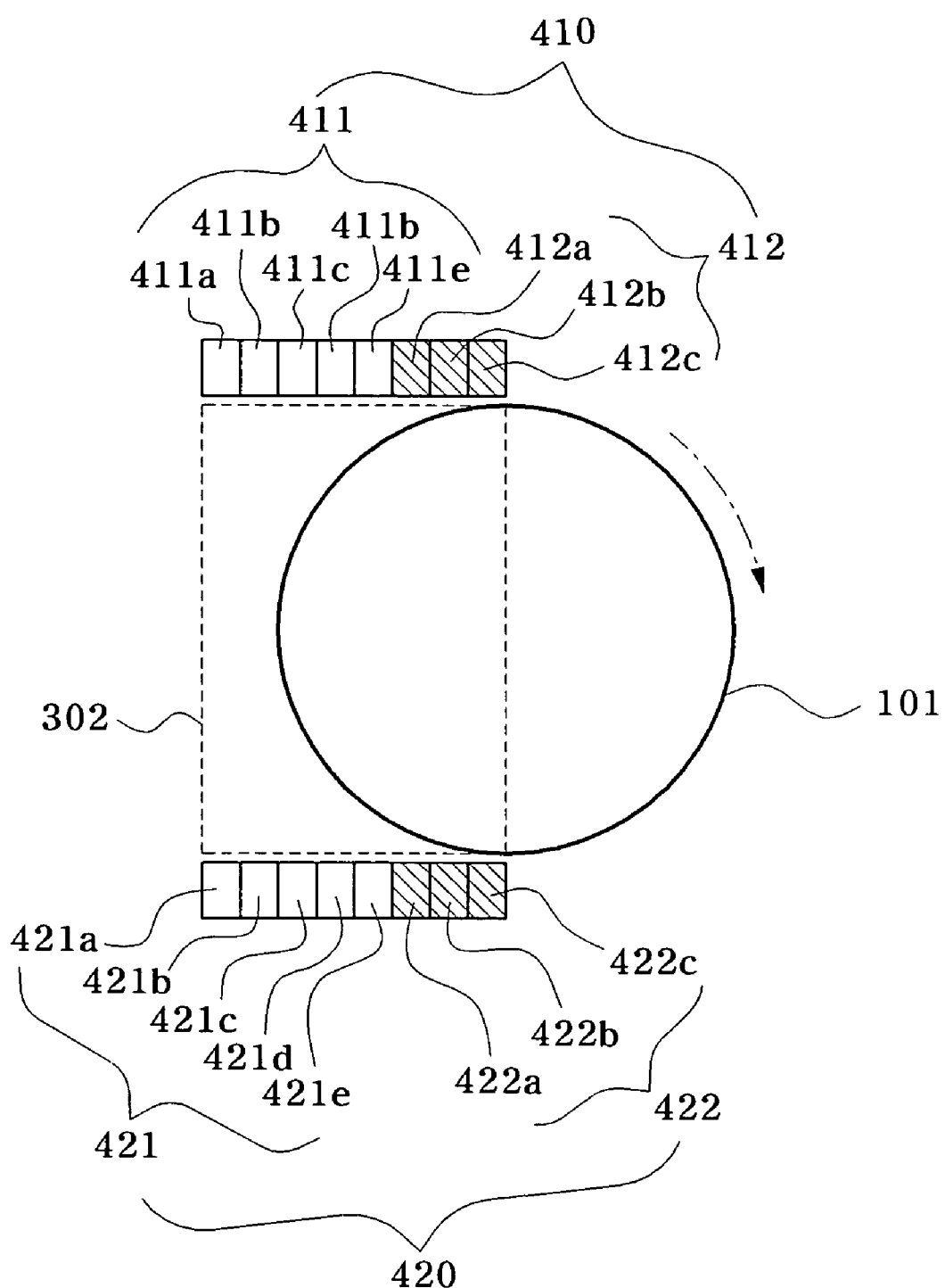
FIG. 5 is a view illustrating a wafer and the wide ion beam generator of FIG. 4 viewed in a direction of arrow A in FIG. 4.

FIG. 4 is a view illustrating one example of a wide ion beam generator of FIG. 3, and FIG. 5 is a view illustrating a wafer and the wide ion beam generator of FIG. 4 viewed in the direction of arrow A in FIG. 4.

Referring to FIGS. 4 and 5, the wide ion beam generator 400 of the embodiment includes upper and lower magnetrons 410 and 420 separated a predetermined distance d from each other in the vertical direction. In one embodiment of the present invention, the distance d between the upper and lower magnetrons 410 and 420 is at least larger than the diameter of the wafer. As shown in FIG. 5, a lower surface of the upper magnetron 410 is located above the uppermost surface of the wafer 101, and an upper surface of the lower magnetron 420 is located below a lowermost surface of the wafer 101. Widths w of the upper and lower magnetrons 410 and 420 may be approximately half of the diameter of the wafer. Thus, the wide ion beams 302 generated by the wide ion beam generator 400 may have an area corresponding to approximately half of the entire area of the wafer 101.

In one embodiment of the present invention, the upper magnetron 410 is formed using a plurality of unit upper magnetrons 411a-e, 412a, 412b, and 412c attached in parallel. In this embodiment, the number of unit upper magnetrons is eight, but it should be noted that eight unit upper magnetrons 410 are provided as an example, and that the present invention is not limited to this structure. Each of the unit upper magnetrons 411a-e, 412a, 412b, and 412c is connected to a power source (not shown) through which different voltages are applied to respective groups. More specifically, a lower voltage may be applied to a first upper group 411 of first unit upper magnetrons 411a-e, while a higher voltage may be applied to a second upper group 412 of second unit upper magnetrons 412a, 412b, and 412c. Also, the higher voltage may be applied to the first upper group 411 of first unit upper magnetrons 411a-e, while the lower voltage can be applied to the second upper group 412 of second unit upper magnetrons 412a, 412b, and 412c.

As with the upper magnetron 410, the lower magnetron 420 is formed of a plurality of unit lower magnetrons 421a-e, 422a, 422b, and 422c attached in parallel. Each of the unit lower magnetrons 421a-e, 422a, 422b, and 422c is connected to the power source (not shown) through which different voltages are applied to respective groups. More specifically, a lower voltage may be applied to a first lower group 421 of first unit lower magnetrons 421a-e, while a higher voltage may be applied to a second lower group 422 of second unit lower magnetrons 422a, 422b, and 422c. Also, the higher voltage may be applied to the first lower group 421 of first unit lower magnetrons 421a-e, while the lower voltage may be applied to the second lower group 422 of second unit lower magnetrons 422a, 422b, and 422c.

In one embodiment of the present invention, the first unit upper magnetrons 411a-411e, comprising the first upper group 411 of the upper magnetron 410 are separated a predetermined distance d in the vertical direction from the first unit lower magnetrons 421a-421e, comprising the first lower group 421 of the lower magnetron 420, and first upper group 411 faces first lower group 421. Similarly, the second unit upper magnetrons 412a, 412b, and 412c comprising the second upper group 412 of the upper magnetron 410 are separated a predetermined distance d in the vertical direction from the second unit lower magnetrons 422a, 422b, and 422c comprising the second lower group 422 of the lower magnetron 420, and second upper group 412 faces second lower group 422.

Accordingly, when a higher voltage is applied to the first unit upper magnetrons 411a-411e and the first unit lower magnetrons 421a-421e, and a lower voltage is applied to the second unit upper magnetrons 412a-412c and the second unit lower magnetrons 422a-422c, wide ion beams having a higher dose are generated between the first unit upper magnetrons 411a-411e and the first unit lower magnetrons 421a-421e, and wide ion beams having a lower dose are generated between the second unit upper magnetrons 412a-412c and the second unit lower magnetrons 422a-422c.

In another embodiment of the present invention, when a lower voltage is applied to the first unit upper magnetrons 411a-411e and the first unit lower magnetrons 421a-421e, and a higher voltage is applied to the second unit upper magnetrons 412a-412c and the second unit lower magnetrons 422a-422c, the wide ion beams of a lower dose are generated between the first unit upper magnetrons 411a-411e and the first unit lower magnetrons 421a-421e, and the wide ion beams of a higher dose are generated between the second unit upper magnetrons 412a-412c and the second unit lower magnetrons 422a-422c.

The non-uniform ion implantation apparatus may irradiate wide ion beams 302 having different doses to the wafer 101 using the wide ion beam generator 400 constructed as described above. In one embodiment of the present invention, the area of the wafer 101 irradiated by the wide ion beams 302 generated by the wide ion beam generator 400 occupies approximately half of the entire area of the wafer 101. As a result, the impurity ions in the wide ion beams 302 are implanted only to the half of the area of the wafer 101. While the wide ion beams 302 are irradiated to the wafer 101, the wafer 101 is rotated in the predetermined direction, as shown in FIG. 5. Although the wafer 101 is illustrated as rotating in the clockwise direction in FIG. 5, it should be noted that the wafer 101 can be rotated in a counterclockwise direction. That is, while the wafer 101 is rotated, the impurity ions are implanted only to the half area of the wafer 101. In particular, since the wide ion beams 302 have different doses, the impurity ions of different concentrations are implanted at the central region and a periphery of the wafer 101.

Figure 6:
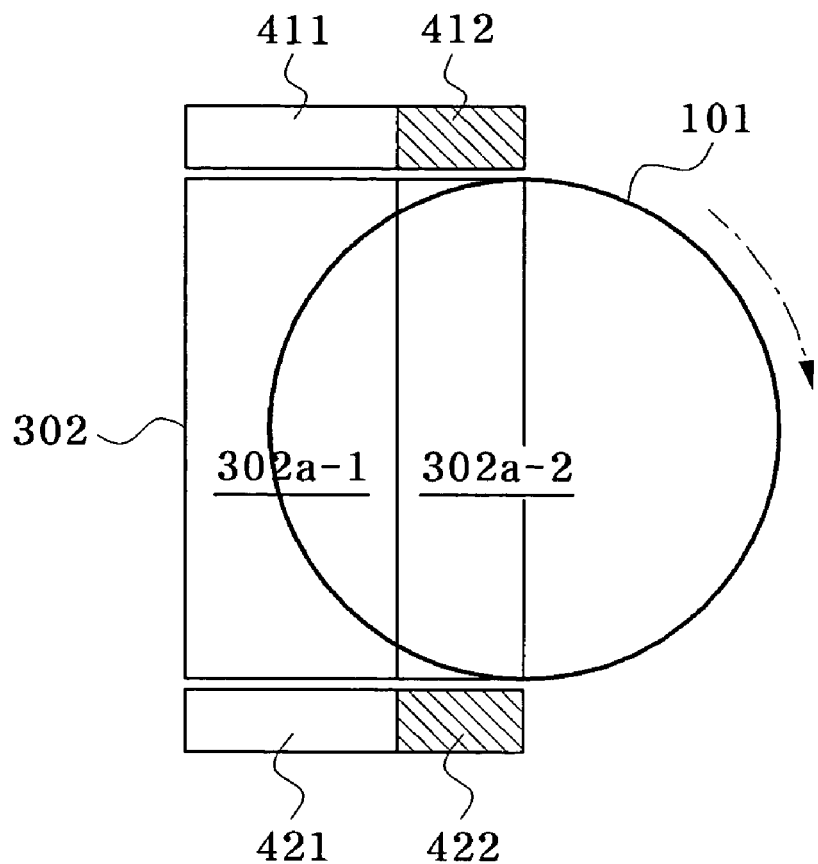
FIGS. 6 and 7 are views illustrating one example of a non-uniform ion implantation method using the wide ion beam generator of FIG. 4.
Figure 7:
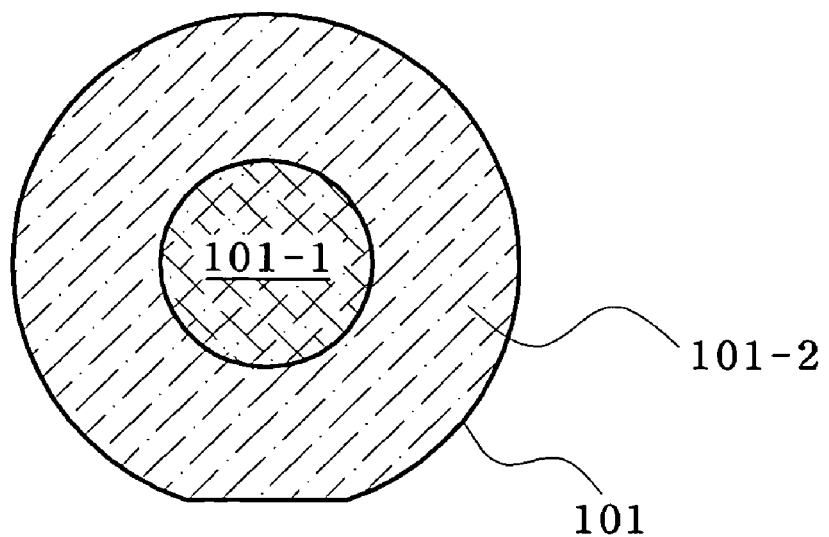

FIGS. 6 and 7 are views illustrating one example of a non-uniform ion implantation method using the wide ion beam generator of FIG. 4.

Referring to FIG. 6, wide ion beams 302 comprising a first wide ion beam 302a-1 of a first dose, and a second wide ion beam 302a-2 of a second dose higher than the first dose are generated. The first wide ion beam 302a-1 is generated by the unit upper magnetrons in the first upper group 411 and the unit lower magnetrons in the first lower group 421. The second wide ion beam 302a-2 is generated by the unit upper magnetrons in the second upper group 412 and the unit lower magnetrons in the second lower group 422. It should be noted that the unit magnetrons in the first and second upper groups 411 and 412 and in the first and second lower groups 421 and 422 are not illustrated in detail for purposes of simplifying the illustration.

In one embodiment of the present invention, in order to generate the first wide ion beam 302a-1 of the first lower dose and the second wide ion beam 302a-2 of the second higher dose, a lower voltage is applied to the first unit upper magnetrons of the first upper group 411 and the first unit lower magnetrons of the first lower group 421, and a higher voltage is applied to the second unit upper magnetrons in the second upper group 412 and the second unit lower magnetrons in the second lower group 422. It should be appreciated that the dose may be changed by applying a higher voltage to the first unit upper magnetrons of the first upper group 411 and the first unit lower magnetrons of the first lower group 421, and applying a lower voltage to the second upper magnetrons in the second upper group 412 and the second unit lower magnetrons in the second lower group 422.

When the ion implantation is performed under the conditions as described above, the ion implantation may be performed to the left side of the wafer where the wide ion beams 302 irradiate, as shown in FIGS. 5 and 6. The concentration of the impurity ions implanted to the wafer 101 may become different at a region adjacent to the periphery of the wafer 101 and at a region adjacent to the center of the wafer 101 with respect to a vertical line corresponding to a border between the first and second wide ion beams 302a-1 and 302a-2. More specifically, the impurity ions of the first lower dose are implanted to the region adjacent to the periphery of the wafer with the first wide ion beam 302a-1, while the impurity ions of the second higher dose are implanted to the region adjacent to the center of the wafer with the second wide ion beam 302a-2.

In order to allow the ion implantation to be performed over the entire area of the wafer 101, the wafer 101 may be rotated in a predetermined direction, as indicated by arrow in FIG. 6, while the wide ion beams 302 are irradiated to the wafer 101. A rotational speed of the wafer 101 may be in a range of about 20 to 1,500 rpm. As the wafer 101 is continuously rotated during the ion implantation, the ion implantation is performed over the entire area of the wafer 101. If irradiation of the wide ion beams 302 to the wafer 101 is performed while the wafer 101 is rotated as described above, the region of the wafer 101 to which the impurity ions are implanted is divided into a first region 101-1 to which the impurity ions of a higher concentration are implanted, and a second region 101-2 to which the ion impurities of a lower concentration are implanted, as shown in FIG. 7. Here, the first region 101-1 is the central region of the wafer 101, and the second region 101-2 is the periphery of the wafer 101. The first region 101-1 is formed by continuously implanting the impurity ions with the second wide ion beam 302a-2 while the wafer 101 is rotated 360 degrees. The second region 101-2 is formed by implanting the ion impurities for a predetermined section of the second region 101-2 with the first wide ion beam 302a-1 and for another predetermined section thereof with the second wide ion beam 302a-2. Thus, after the implantation, the first region 101-1 has a higher impurity ion concentration than that of the second region 101-2.

As described above, a series of processes for irradiating the wide ion beams 302 to the wafer 101 while rotating the wafer 101 are continuously performed. Thus, the impurity ions are continuously implanted over the entire area of the wafer 101 resulting in a smooth circular border between the first and second regions 101-1 and 101-2. Although rotation of the wafer 101 can be 360 degrees (one revolution), the wafer 101 can also be rotated more than one revolution. An increased number of revolutions of the wafer 101 may result in a more circular border between the first and second regions 101-1 and 101-2.

Figure 8:
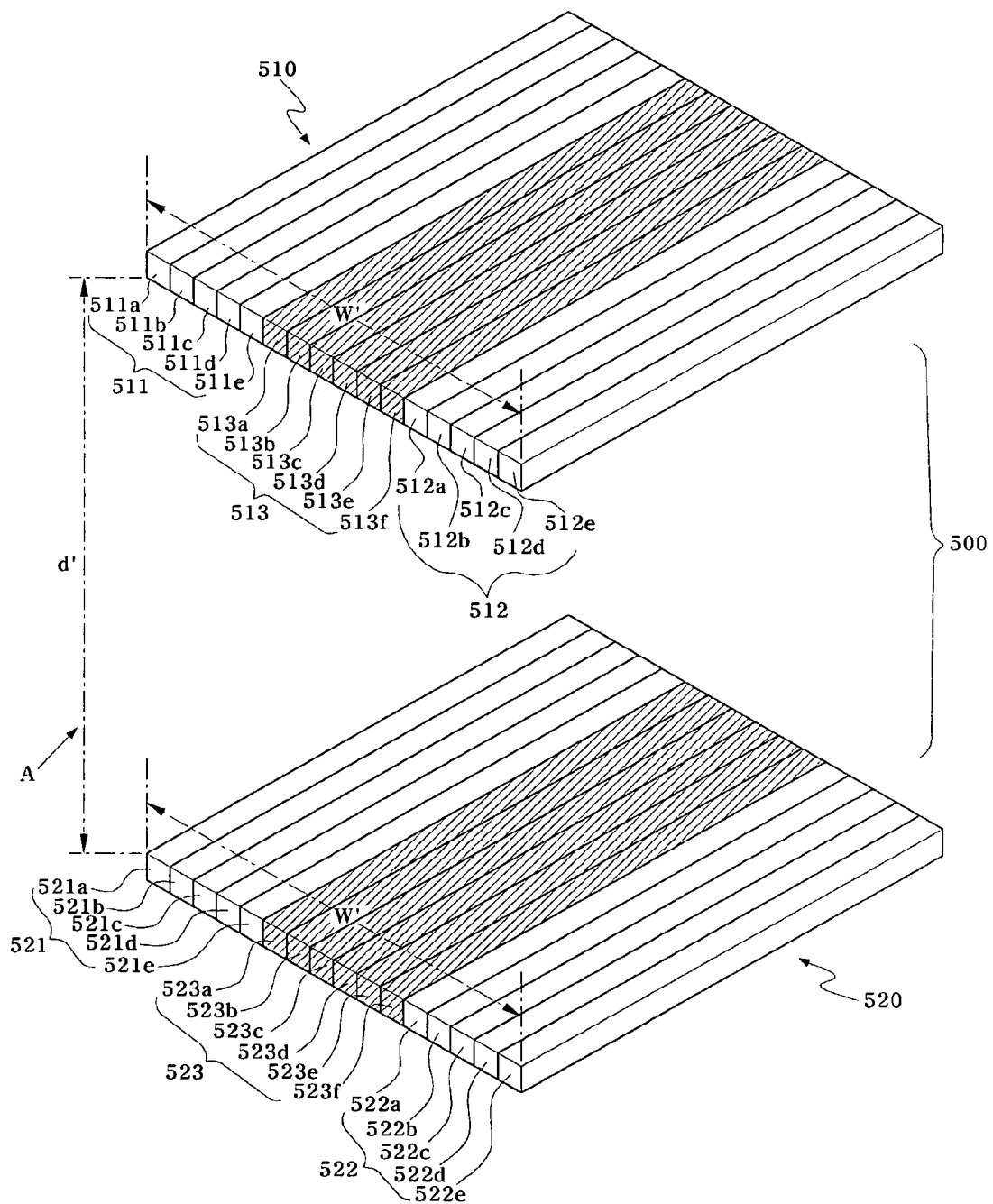
FIG. 8 is a view illustrating other embodiment of a wide ion beam generator of FIG. 3.
Figure 9:
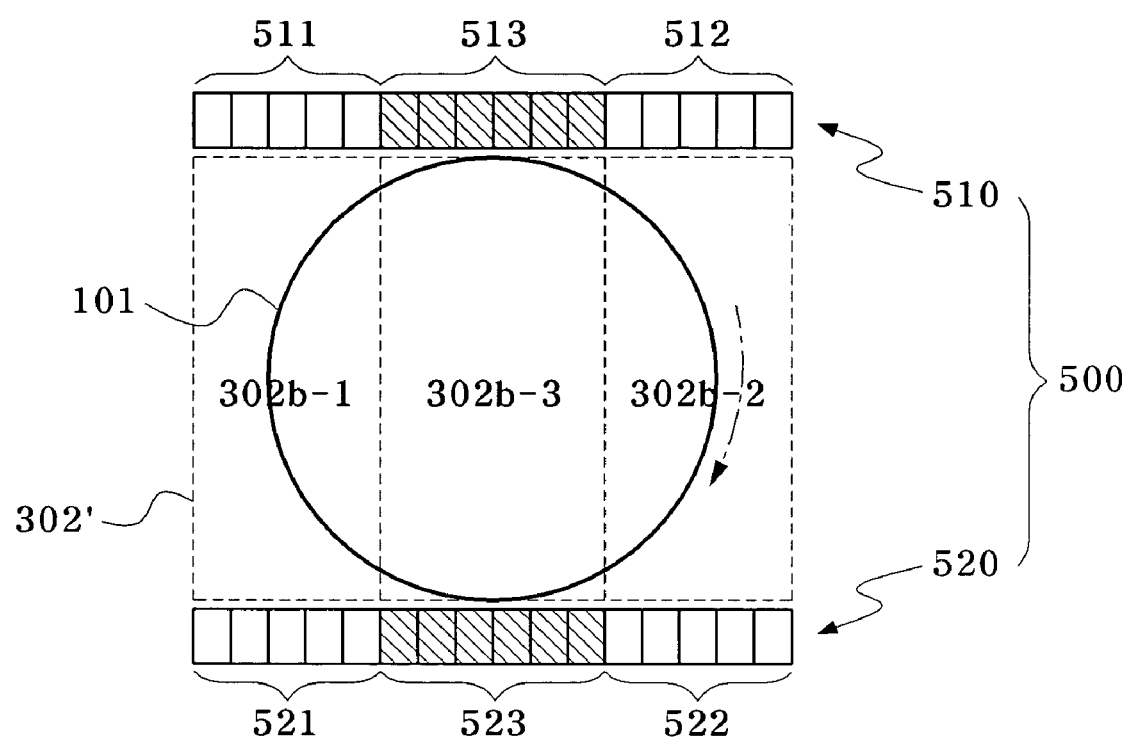
FIG. 9 is a view illustrating a wafer and the wide ion beam generator of FIG. 8 viewed in the direction of arrow A in FIG. 8.

FIG. 8 is a view illustrating another embodiment of a wide ion beam generator of FIG. 3, and FIG. 9 is a view illustrating a wafer and the wide ion beam generator of FIG. 8 viewed in the direction of arrow A in FIG. 8.

Referring to FIGS. 8 and 9, the ion beam generator 500 may include upper and lower magnetrons 510 and 520 separated a predetermined distance d' from each other in a vertical direction. In one embodiment of the present invention, the ion beam generator 500 is the same as the wide ion beam generator 400 described above in that the distance d' between the upper and lower magnetrons 510 and 520 is larger than at least the diameter of the wafer 101. Thus, a lower surface of the upper magnetron 510 may also be located above the uppermost surface of the wafer 101, and an upper surface of the lower magnetron 520 may be located below the lowermost surface of the wafer 101. However, the ion beam generator 500 is different from the wide ion beam generator 400 in that the width w' of the upper magnetron 510 and the lower magnetron 520 are approximately the same as the diameter of the wafer 101. Thus, the wide ion beams 302' generated by the wide ion beam generator 500 may have a cross sectional area larger than an entire area of the wafer 101, and irradiate the entirety of the wafer 101.

The upper magnetron 510 comprises a plurality of unit upper magnetrons 511a-511e, 512a-512e, and 513a-513c attached in parallel. First unit upper magnetrons 511a-511e and second unit upper magnetrons 512a-512e are located at both sides to form a first upper group 511 and a second upper group 512. Third unit upper magnetrons 513a-513c are located between the first and second unit upper magnetrons 511a-511e and 512a-512e to form a third upper group 513. Each of the unit upper magnetrons 511a-511e, 512a-512e, and 513a-513c is connected to a power source (not shown) through which different voltages are applied to respective groups. More specifically, a lower voltage can be applied to the first unit upper magnetrons 511a-511e and the second unit upper magnetrons 512a-512e, while a higher voltage can be applied to the third unit upper magnetrons 513a-513c. It should be appreciated that the voltages can be applied thereto opposite to the above description.

As with the upper magnetron 510, the lower magnetron 520 comprises a plurality of unit lower magnetrons 521a-521e, 522a-522e, and 523a-523c attached in parallel. First unit lower magnetrons 521a-521e and second unit lower magnetrons 522a-522e are located at both sides to form a first lower group 521 and a second lower group 522. Third unit lower magnetrons 523a-523c are located between the first and second unit lower magnetrons 521a-521e and 522a-522e to form a third lower group 523. Each of the unit lower magnetrons 521a-521e, 522a-522e, and 523a-523c is connected to a power source (not shown) through which different voltages are applied to respective groups. More specifically, a lower voltage can be applied to the first unit lower magnetrons 521a-521e and the second unit lower magnetrons 522a-522e, while a higher voltage can be applied to the third unit lower magnetrons 523a-523c. The voltages may also be applied thereto opposite to the above description.

The first unit upper magnetrons 511a-511e and the second unit upper magnetrons 512a-512e are separated a predetermined distance d' in the vertical direction from the first unit lower magnetrons 521a-521e and the second unit lower magnetrons 522a-522e while facing thereto, respectively. Similarly, the third unit upper magnetrons 513a-513c are separated a predetermined distance d' in the vertical direction from the third unit lower magnetrons 523a-523c while facing thereto, respectively.

Accordingly, when a lower voltage is applied to the first unit upper magnetrons 511a-511e and the first unit lower magnetrons 521a-521e, a first wide ion beam 302b-1 (FIG. 9) of a lower dose is formed therebetween. Similarly, when the lower voltage is applied to the second unit upper magnetrons 512a-512e and the second unit lower magnetrons 522a-522e, a second wide ion beam 302b-2 of a lower dose is formed therebetween. On the contrary, when a higher voltage is applied to the third unit upper magnetrons 513a-513c and to the third unit lower magnetrons 523a-523c, a third wide ion beam 302b-3 of a higher dose is formed therebetween. It should be appreciated that the ion beam generator 500 may be operated to allow the first and second wide ion beams 302b-1 and 302b-2 to have the higher dose, and to allow the third wide ion beam 302b-3 to have a lower dose.

In one embodiment of the present invention, the non-uniform ion implantation apparatus irradiates the wide ion beams 302' having different doses to the wafer 101 using the wide ion beam generator 500 constructed as described above. The area of the wafer 101 irradiated by the wide ion beams 302' generated by the wide ion beam generator 500 occupies the entire area of the wafer 101. While the wide ion beams 302' are irradiated to the wafer 101, the wafer 101 is rotated in a predetermined direction, as shown in FIG. 9. Although the wafer 101 is illustrated as rotating in a clockwise direction in FIG. 9, it should be noted that the wafer 101 can be rotated in a counterclockwise direction. That is, while the wafer 101 is rotated, the impurity ions are implanted to the entire area of the wafer 101. In particular, since the wide ion beams 302' have different doses, the impurity ions of different concentrations are implanted to a central region and a periphery of the wafer 101.

More specifically, at an initial stage when the wafer 101 begins to rotate, the wide ion beams 302' comprise first and second wide ion beams 302b-1 and 302b-2 of a first lower dose, and a third wide ion beam 302b-3 of a second dose higher than the first dose. The first wide ion beam 302b-1 is generated by the first unit upper magnetrons in the first upper group 511 and by the first unit lower magnetrons in the first lower group 521. The second wide ion beam 302b-2 is generated by the second unit upper magnetrons in the second upper group 512 and by the second unit lower magnetrons in the second lower group 522. Additionally, the third wide ion beam 302b-3 is generated by the third unit upper magnetrons in the third upper group 513, and by the third unit lower magnetrons in the third lower group 523.

As in this example, in order to form the first and second wide ion beams 302b-1 and 320b-2 of the first lower dose, and the third wide ion beam 302b-3 of the second higher dose, the lower voltage is applied to the first and second unit upper magnetrons in the first and second upper groups 511 and 512, and to the first and second unit lower magnetrons in the first and second lower groups 521 and 522, and the higher voltage is applied to the third unit upper magnetrons in the third upper group 513 and the third unit lower magnetrons in the third lower group 523. Change of the dose opposite to the above description can be performed by applying higher and lower voltages thereto, respectively.

When the ion implantation is performed under the condition as described above, the impurity ions are implanted over the entire area of the wafer. In this case, the concentration of the impurity ions implanted to the wafer 101 varies at regions adjacent to the left and right sides of the wafer 101 and at a region adjacent to the center of the wafer 101 with respect to a vertical line corresponding to the border between the first and third ion beams 302b-1 and 302b-3, and a vertical line corresponding to a border between the second and third wide ion beams 302b-2 and 302b-3, respectively. More specifically, the impurity ions of the first lower dose are implanted to the regions adjacent to the left and right edges of the wafer 101 with the first and second wide ion beams 302b-1 and 302b-2, while the impurity ions of the second higher dose are implanted to the region adjacent to the center of the wafer 101 with the third wide ion beam 302b-3.

Such ion implantation may be performed at the same time over the entire area of the wafer 101 as the wafer 101 is rotated. As the ion implantation is continuously performed while the wafer 101 is rotated 360 degrees, the region of the wafer 101 to which the impurity ions are implanted is divided into a first region 101-1 to which the impurity ions of a higher concentration are implanted, and a second region 101-2 to which the ion impurities of a lower concentration are implanted, as shown in FIG. 7. Here, the first region 101-1 is the central region of the wafer 101, and the second region 101-2 is the periphery of the wafer 101. The first region 101-1 is formed by continuously implanting the impurity ions with the third wide ion beam 302b-3 while the wafer 101 is rotated 360 degrees. The second region 101-2 is formed by implanting the ion impurities for a predetermined section of the second region 101-2 with the first wide ion beam 302b-1, for another predetermined section thereof with the second wide ion beam 302b-2, and for a third predetermined section thereof with the third wide ion beam 302b-3. Thus, after the ion implantation, the first region 101-1 has impurity ions of a higher concentration than that of second region 101-2.

As described above, a series of processes for irradiating the wide ion beams 302' to the wafer 101 while rotating the wafer 101 is performed continuously. Thus, the impurity ions are continuously implanted over the entire area of the wafer 101 resulting in a smooth circular border between the first and second regions 101-1 and 101-2. Although rotation of the wafer 101 can be 360 degrees (one revolution), the wafer 101 can be rotated more than one revolution. It should be appreciated that an increased number of revolutions of the wafer 101 results in a more circular border between the first and second regions 101-1 and 101-2.

Figure 10:
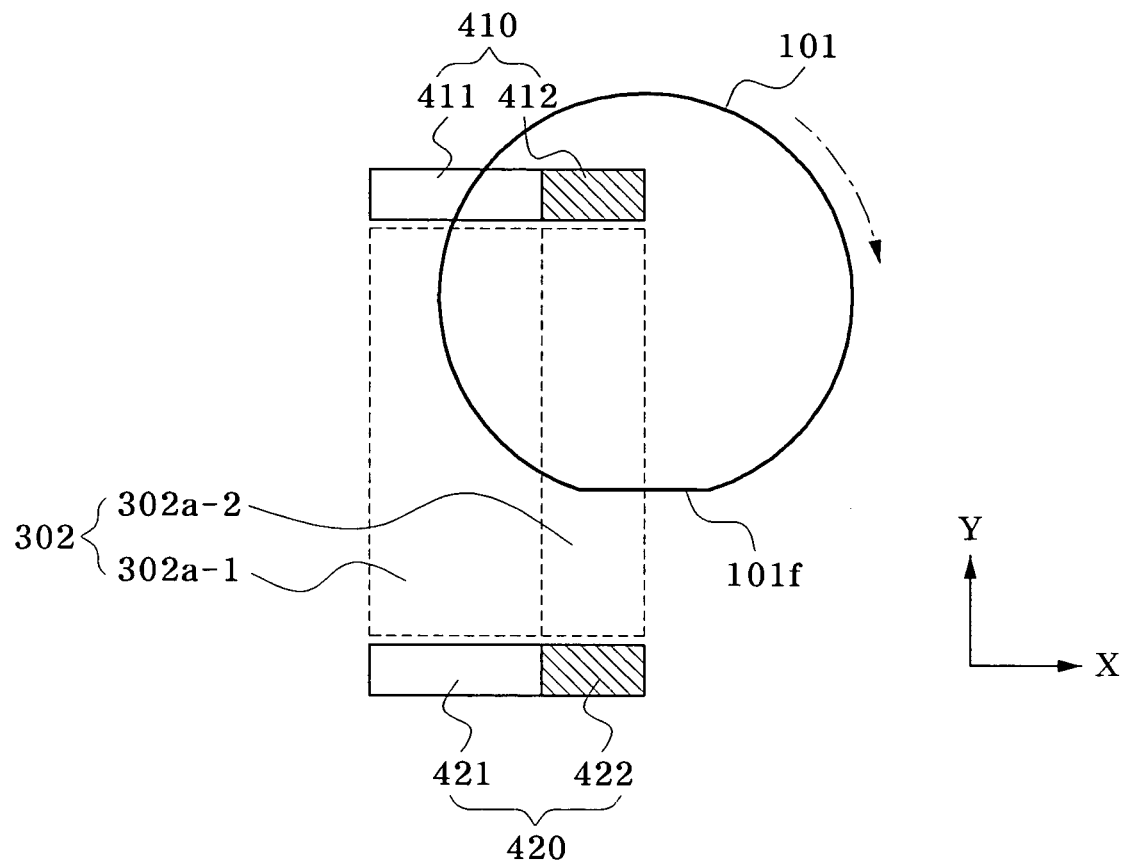
FIGS. 10 and 11 are views illustrating another example of the non-uniform ion implantation method using the non-uniform ion implantation apparatus in accordance with an embodiment of the present invention.
Figure 11:
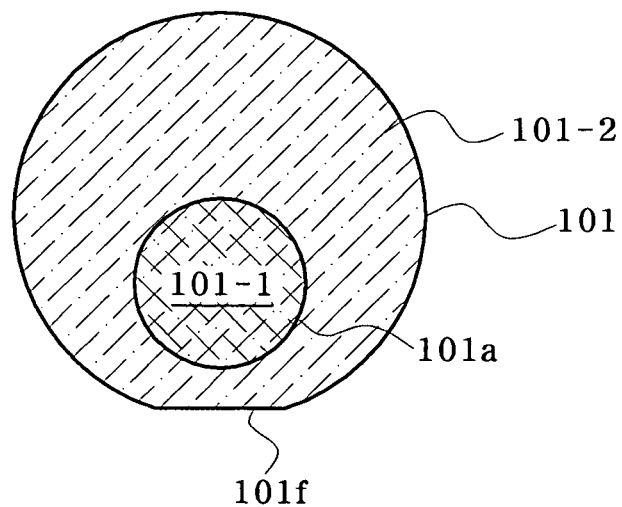

FIGS. 10 and 11 are views illustrating one example of the non-uniform ion implantation method using the non-uniform ion implantation apparatus in accordance with one embodiment of the present invention.

Referring to FIGS. 10 and 11, the non-uniform ion implantation apparatus used for this example includes the wide ion beam generator 400 shown in FIGS. 4 and 5. Thus, description of the wide ion beam generator 400 will be omitted in this example. For the non-uniform ion implantation method of this example, the wide ion beams 302 generated by the wide ion beam generator 400 are continuously irradiated to the wafer 101, moving a position of the wafer 101 with respect to the wide ion beam 400, while rotating the wafer 101 as indicated by the arrow in FIG. 10.

More specifically, with the flat zone 101f of the wafer 101 located at a lower portion of the wafer, the wafer 101 is moved by a predetermined distance in the Y direction. Then, some upper portion of the wafer 101, that is, a region of the wafer 101 above the upper magnetron 410 is not irradiated by the wide ion beams 302, so that this region is not implanted with the impurity ions. In one embodiment of the present invention, a lower portion of the wafer 101 on the left half of a region of the wafer 101 between the upper magnetron 410 and the lower magnetron 420 is irradiated by the wide ion beams 302, so that only this region is implanted with the impurity ions. The wide ion beams 302 comprises first wide ion beam 302a-1 formed to have a lower (or higher) dose by the first upper and lower groups 411 and 421 and second wide ion beam 302a-2 formed to have a higher (or lower) dose by the second upper and lower groups 412 and 422. Accordingly, the impurity ions of different doses are implanted to the first and second regions 101-1 and 101-2 of the wafer 101 divided by the circular border 101a as the wafer 101 is rotated in a state wherein the wafer 101 is disposed between the upper and lower magnetrons 410 and 410 such that the wide ion beams 302 described above irradiate a predetermined region of the wafer 101.

In one embodiment, if the first wide ion beam 302a-1 has a lower dose than the second wide ion beam 302a-2, the concentration of the impurity ions is higher at the first region 101-1 than at the second region 101-2. In another embodiment, the concentration of the impurity ions is lower at the first region 101-1 than at the second region 101-2. First region 101-1 is more biased to the flat zone 101f because the wafer 101 is initially disposed upwardly by a predetermined distance in the Y direction. As such, by suitably adjusting the initial position of the wafer 101 in the Y direction, it is possible to suitably bias the first region 101-1 of the wafer towards the flat zone 101f of the wafer 101.

Figure 12:
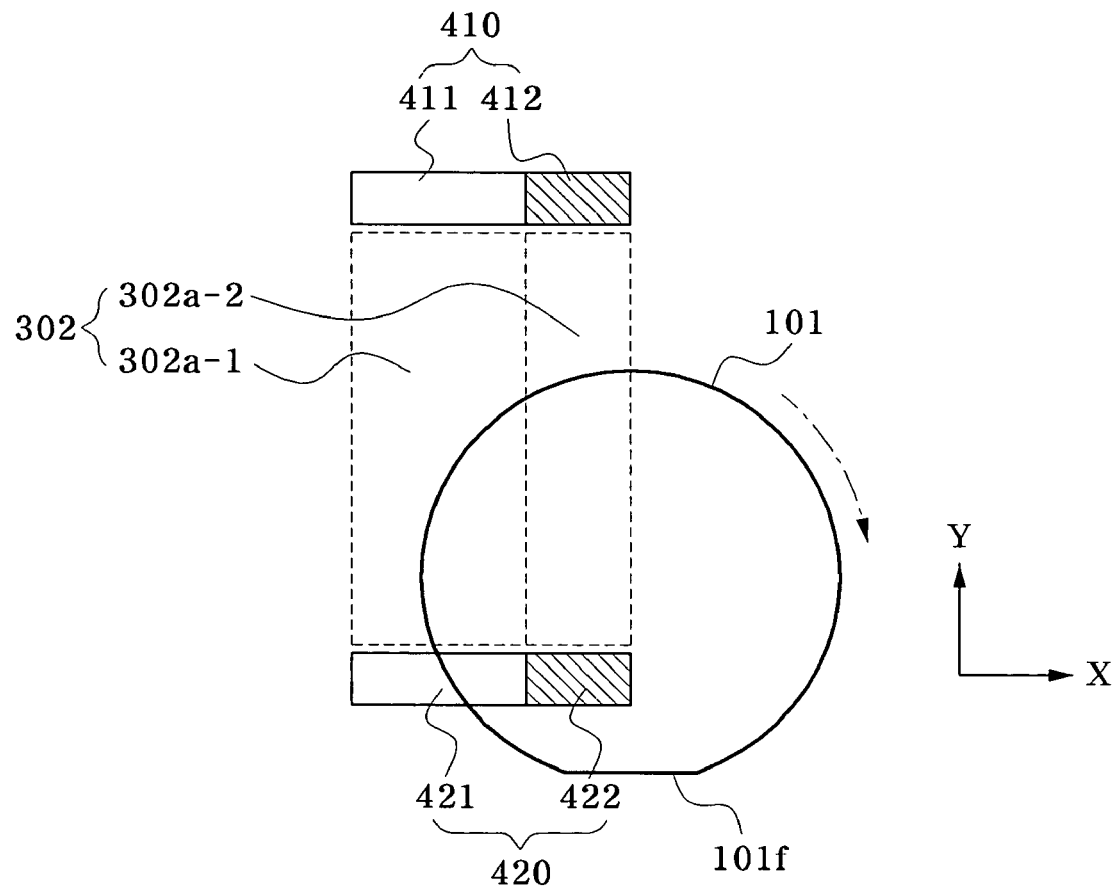
FIGS. 12 and 13 are views illustrating still another example of the non-uniform ion implantation method using the non-uniform ion implantation apparatus in accordance with an embodiment of the present invention.
Figure 13:
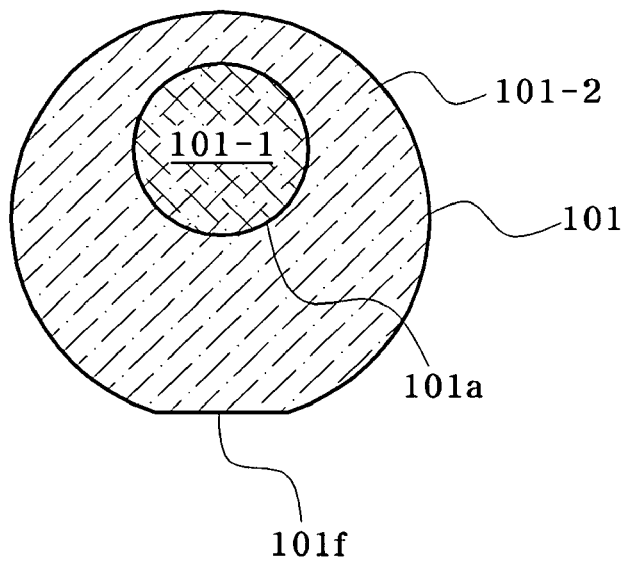

FIGS. 12 and 13 are views illustrating another example of the non-uniform ion implantation method using the non-uniform ion implantation apparatus according to one embodiment of the present invention.

Referring to FIGS. 12 and 13, the non-uniform ion implantation apparatus used for this example includes the wide ion beam generator 400 shown in FIGS. 4 and 5. Thus, description of the wide ion beam generator 400 will be omitted in this example. For the non-uniform ion implantation method of this example, the wide ion beams 302 generated by the wide ion beam generator 400 are continuously irradiated to the wafer 101, moving a position of the wafer 101 with respect to the wide ion beam 400, while rotating the wafer 101 as indicated by the arrow in FIG. 12.

More specifically, with a flat zone 101f of the wafer 101 located at a lower portion of the wafer, the wafer 101 is moved by a predetermined distance in the X direction perpendicular to the Y direction. Then, a region of the wafer 101 below the lower magnetron 410 is not irradiated by the wide ion beams 302, so that this region is not implanted with the impurity ions. In one embodiment of the present invention, a left half of a region of the wafer 101 between the upper magnetron 410 and the lower magnetron 420 is irradiated by the wide ion beams 302, so that only this region is implanted with the impurity ions. Accordingly, the impurity ions of different doses are implanted to the first and second regions 101-1 and 101-2 of the wafer 101 as the wafer 101 is rotated in a state wherein the wafer 101 is disposed between the upper and lower magnetrons 410 and 410 such that the wide ion beams 302 comprising the first wide ion beam 302a-1 formed to have a lower (or higher) dose and the second wide ion beam 302a-2 formed to have a higher (or lower) dose are irradiated to a predetermined region of the wafer 101 described above. First region 101-1 is more biased in a direction opposite to the flat zone 101f of the wafer 101 because the wafer 101 is disposed downwardly a predetermined distance in the –Y direction at the initial time. As such, by suitably adjusting the initial position of the wafer 101 in the –Y direction, it is possible to suitably bias the first region 101-1 of the wafer 101 in the opposite direction of the flat zone 101f of the wafer 101.

Figure 14:
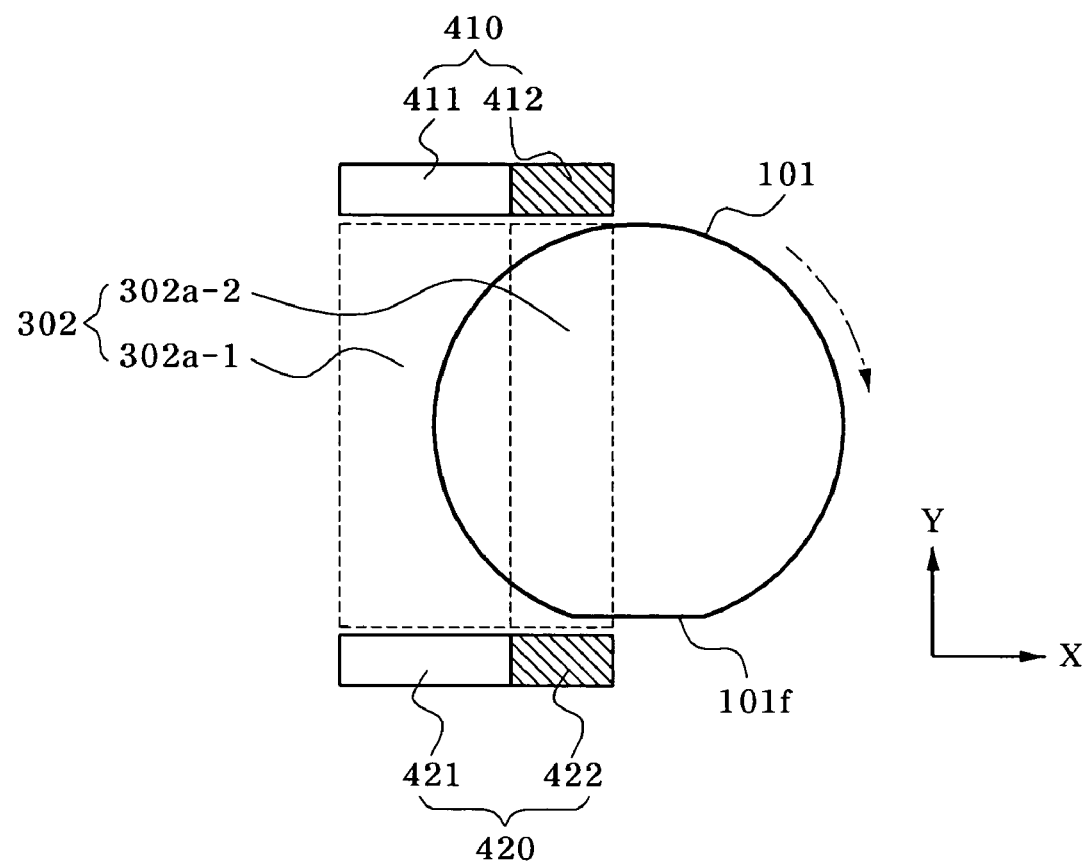
FIGS. 14 and 15 are views illustrating another example of the non-uniform ion implantation method using the non-uniform ion implantation apparatus in accordance with an embodiment of the present invention.
Figure 15:
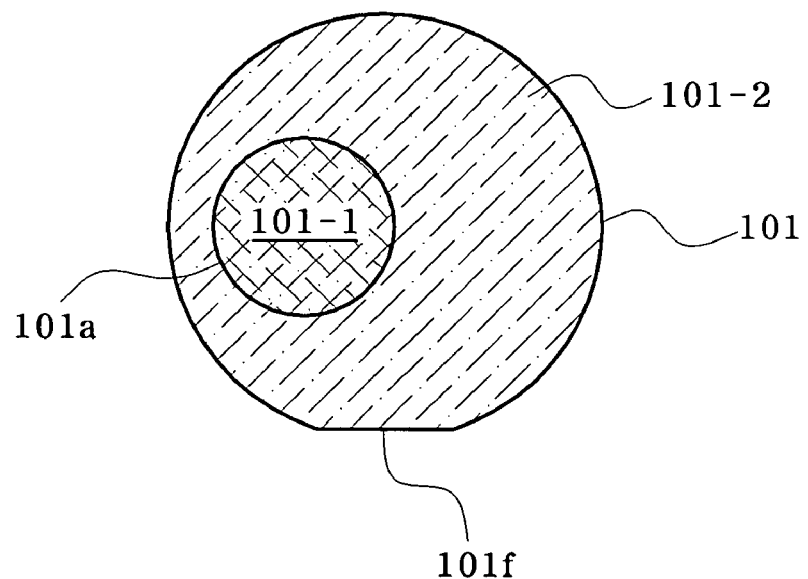

FIGS. 14 and 15 are views illustrating another example of the non-uniform ion implantation method using the non-uniform ion implantation apparatus according to one embodiment of the present invention.

Referring to FIGS. 14 and 15, the non-uniform ion implantation apparatus used for this example includes the wide ion beam generator 400 shown in FIGS. 4 and 5. Thus, description of the wide ion beam generator 400 will also be omitted in this example. For the non-uniform ion implantation method of this example, the wide ion beams 302 generated by the wide ion beam generator 400 are continuously irradiated to the wafer 101, moving a position of the wafer 101 with respect to the wide ion beam 400, while rotating the wafer 101 as indicated by the arrow in FIG. 14.

More specifically, with a flat zone 101f of the wafer 101 located at a lower portion of the wafer, the wafer 101 is moved a predetermined distance in the X direction. A predetermined region of the wafer 101 occupying the right side of the wafer 101 and a portion of a left side thereof adjacent to the central region of the wafer 101 is not irradiated by the wide ion beams 302, so that this region is not implanted with the impurity ions. The remaining region of the left side of the wafer 101 is irradiated by the wide ion beams 302, so that only this region is implanted with the impurity ions. Accordingly, the impurity ions of different doses are implanted to the first and second regions 101-1 and 101-2 of the wafer 101 divided by a circular border 101a as the wafer 101 is rotated in a state wherein the wafer 101 is disposed between the upper and lower magnetrons 410 and 410 such that the wide ion beams 302 comprising the first wide ion beam 302a-1 formed to have a lower (or higher) dose and the second wide ion beam 302a-2 formed to have a higher (or lower) dose are irradiated to a predetermined region of the wafer 101 described above. First region 101-1 is more biased to the left side of the flat zone 101f, i.e. in the –X direction of the wafer 101, because the wafer 101 is initially disposed to the right side by the predetermined distance in the X direction. As such, by suitably adjusting an initial position of the wafer in the X direction, it is possible to suitably bias the first region 101-1 of the wafer 101 to the left side of the flat zone 101f of the wafer 101.

Figure 16:
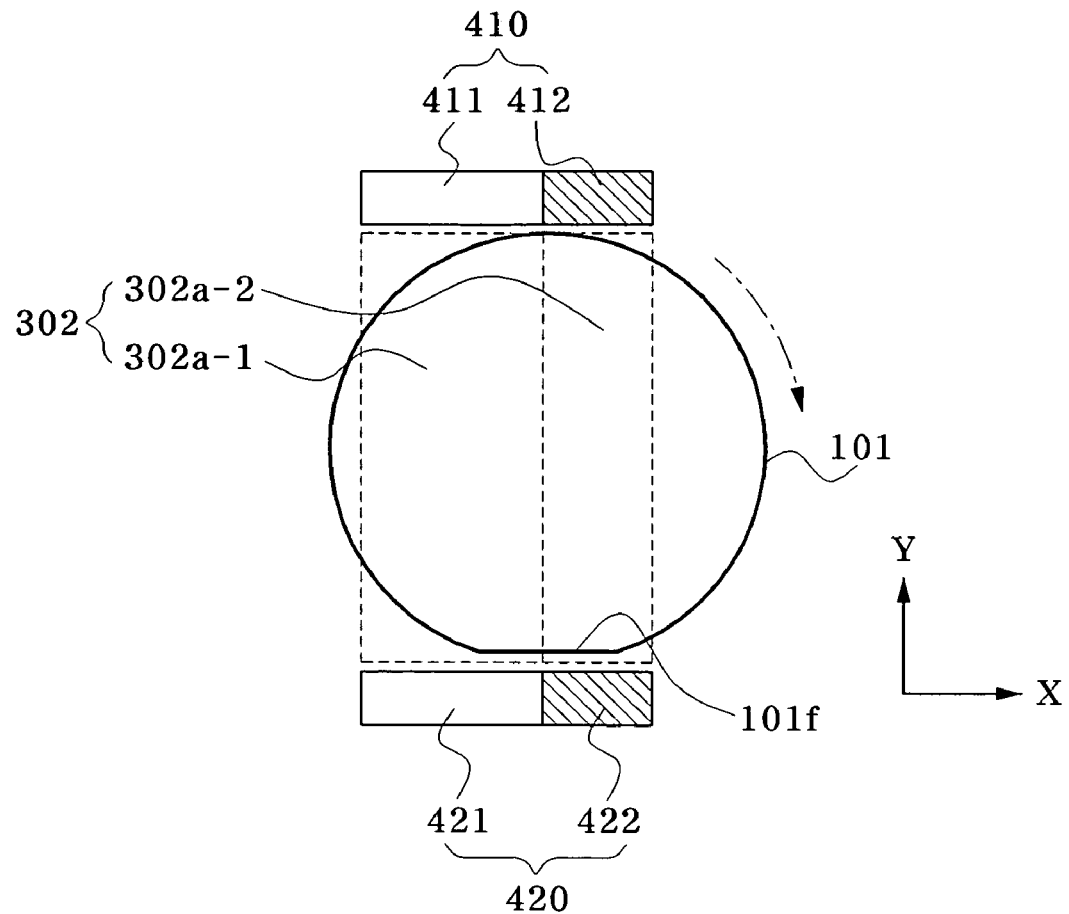
FIGS. 16 and 17 are views illustrating another example of the non-uniform ion implantation method using the non-uniform ion implantation apparatus in accordance with an embodiment of the present invention.
Figure 17:
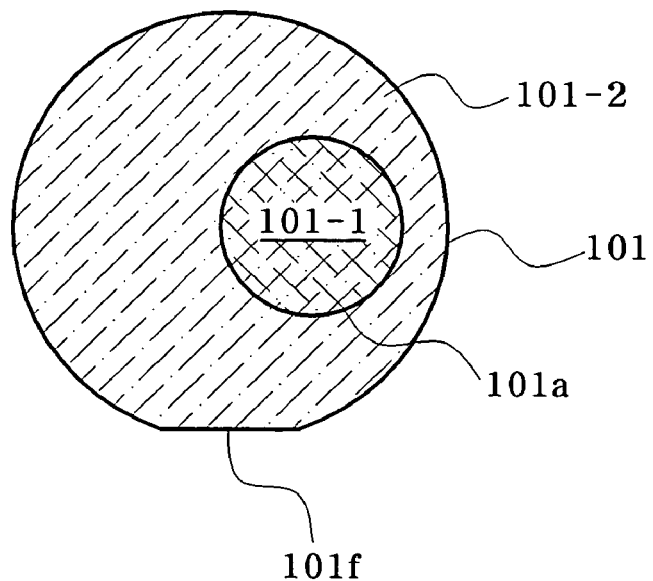

FIGS. 16 and 17 are views illustrating another example of the non-uniform ion implantation method using the non-uniform ion implantation apparatus according to one embodiment of the present invention.

Referring to FIGS. 16 and 17, the non-uniform ion implantation apparatus includes wide ion beam generator 400 shown in FIGS. 4 and 5. Thus, description of the wide ion beam generator 400 will also be omitted in this example. For the non-uniform ion implantation method of this example, the wide ion beams 302 generated by the wide ion beam generator 400 are continuously irradiated to the wafer 101, moving a position of the wafer 101 with respect to the wide ion beam 400, while rotating the wafer 101 as indicated by the arrow in the drawings.

More specifically, with a flat zone 101f of the wafer 101 located at a lower portion of the wafer, the wafer 101 is moved a predetermined distance in the negative X (–X) direction. In this embodiment, a portion of a right region and a portion of a left region of the wafer 101 are not irradiated by the wide ion beams 302 so that these portions are not implanted with the impurity ions. An intermediate region of the wafer 101 between the portion of the right region and the portion of the left region is irradiated by the wide ion beams 302, so that only the intermediate region is implanted with the impurity ions. Accordingly, the impurity ions of different doses are implanted to the first and second regions 101-1 and 101-2 of the wafer 101 divided by a circular border 101a as the wafer 101 is rotated in a state wherein the wafer 101 is disposed between the upper and lower magnetrons 410 and 410 such that the wide ion beams 302 comprising the first wide ion beam 302a-1 has a lower (or higher) dose and the second wide ion beam 302a-2 has a higher (or lower) dose. In this embodiment, the first region 101-1 is more biased to the right side of the flat zone 101f, i.e. in the X direction of the wafer 101, because wafer 101 is initially disposed to the left side a predetermined distance in the –X direction. As such, by suitably adjusting an initial position of the wafer in the X direction, it is possible to suitably bias the first region 101-1 of the wafer 101 to the right side of the flat zone 101f of the wafer 101.

FIGS. 18 to 21 are views illustrating other examples of the non-uniform ion implantation method using the non-uniform ion implantation apparatus in accordance with one embodiment of the present invention. The non-uniform ion implantation apparatus used in FIGS. 18 to 21 includes wide ion beam generator 500 shown in FIGS. 8 and 9. Thus, description of the wide ion beam generator 400 will be omitted hereinafter.

Figure 18:
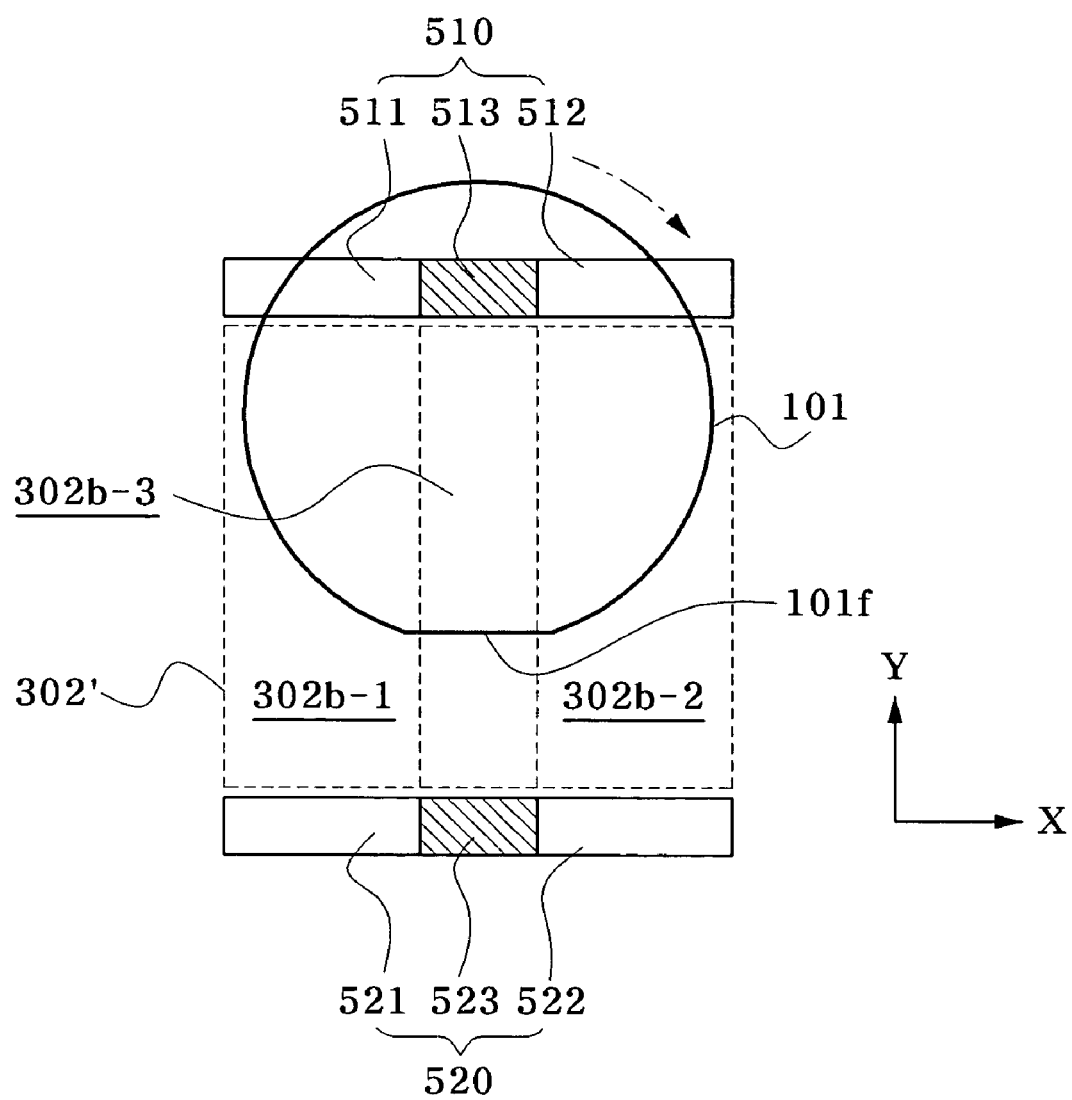
FIGS. 18 to 21 are views illustrating another several examples of the non-uniform ion implantation method using the non-uniform ion implantation apparatus in accordance with an embodiment of the present invention.

First, referring to FIG. 18, this method is directed to biasing the first region 101-1 of the wafer 101 to a lower portion of the wafer as shown in FIG. 11, and more specifically, with a flat zone 101f of the wafer 101 located at a lower portion of the wafer, the wafer 101 is moved by a predetermined distance in the Y direction. Then, a region of the wafer 101 above the upper magnetron 410 is not irradiated by the wide ion beams 302', so that this region is not implanted with the impurity ions. A region of the wafer 101 between the upper magnetron 410 and the lower magnetron 420 is irradiated by the wide ion beams 302', so that only this region is implanted with the impurity ions. The wide ion beams 302' comprise the first and second wide ion beams 302b-1 and 302b-2 formed to have a lower (or higher) dose by the first upper and lower groups 511 and 521, and by the second upper and lower groups 512 and 522, and the third wide ion beam 302b-3 formed to have a higher (or lower) dose by the third upper and lower groups 513 and 523. The third wide ion beam 302b-3 is positioned at the center, and the first and second wide ion beams 302b-1 and 302b-2 are positioned at both sides of the third wide ion beam 302b-3.

With the wafer 101 disposed between the upper and lower magnetrons such that the upper portion of the wafer 101 is not irradiated by the wide ion beams 302', the impurity ions of different doses are implanted to the first and second regions 101-1 and 101-2 of the wafer 101 divided by the circular border 101a while rotating the wafer 101. Then, as shown in FIG. 11, the impurity ions of different doses are implanted to the first region 101-1 and the second region 101-2 of the wafer 101 divided by the circular border 101a. In particular, the first region 101-1 is more biased to the flat zone 101f of the wafer 101. If the first and second wide ion beams 302b-1 and 302b-2 have a lower dose than that of the third wide ion beam 302b-3, the concentration of the impurity ions is higher at the first region 101-1 than at the second region 101-2. If the first and second wide ion beams 302b-1 and 302b-2 have a higher dose than that of the third wide ion beam 302b-3, the concentration of the impurity ions is lower at the first region 101-1 than at the second region 101-2. As such, by suitably adjusting the initial position of the wafer in the Y direction, it is possible to suitably bias the first region 101-1 of the wafer towards the flat zone 101f of the wafer 101.

Figure 19:
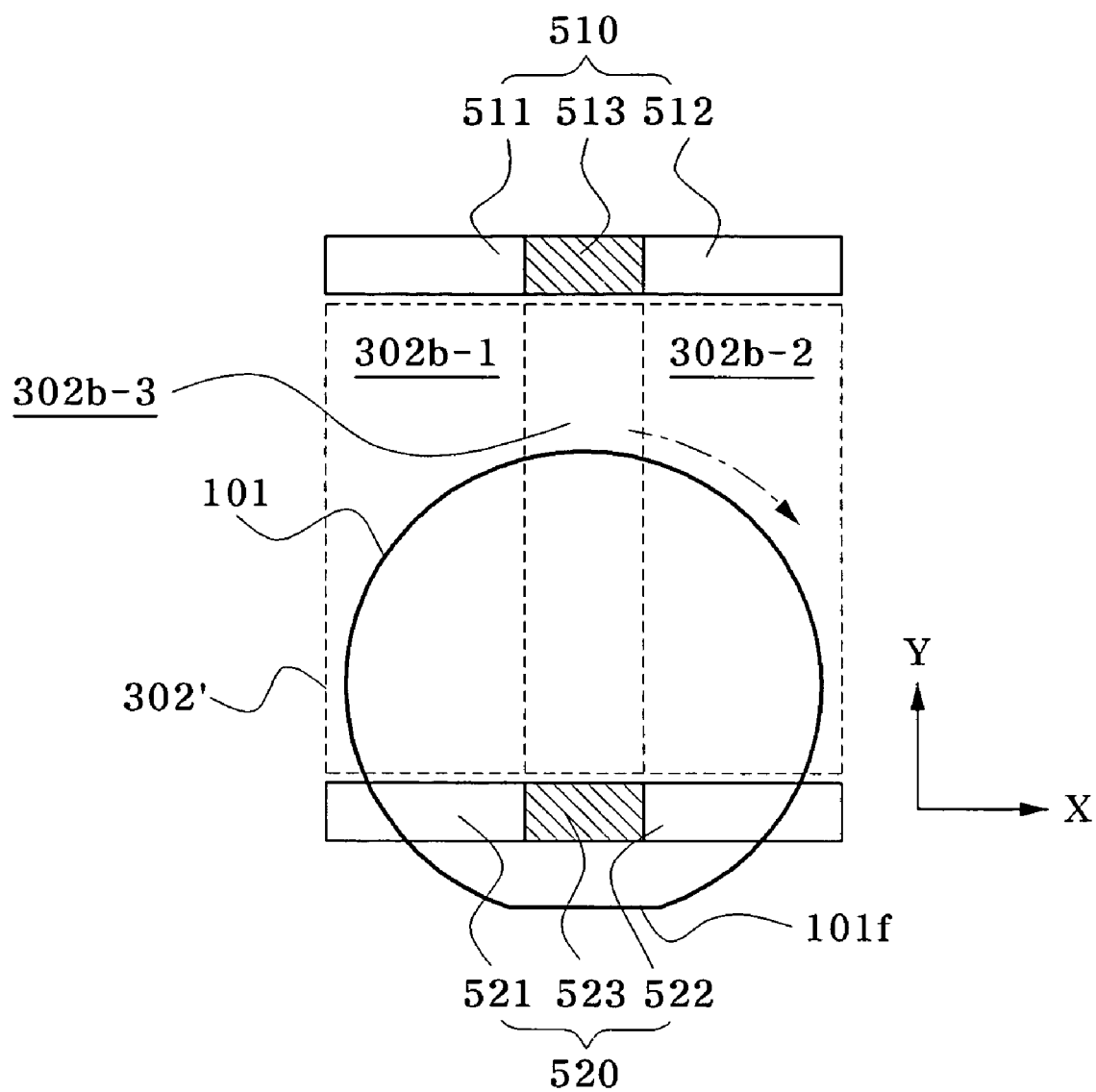

Next, referring to FIG. 19, this method is directed to biasing the first region 101-1 of the wafer 101 to an upper portion of the wafer as shown in FIG. 13, and more specifically, with a flat zone 101f of the wafer 101 located at a lower portion of the wafer, whereby the wafer 101 is moved by a predetermined distance in the Y direction. Then, a region of the wafer 101 below the upper magnetron 410 is not irradiated by the wide ion beams 302', so that this region is not implanted with the impurity ions. A region of the wafer 101 between upper magnetron 410 and the lower magnetron 420 is irradiated by the wide ion beams 302', so that only this region is implanted with the impurity ions.

With the wafer 101 disposed between the upper and lower magnetrons such that the lower portion of the wafer 101 is not irradiated by the wide ion beams 302', the wide ion beams 302' are irradiated to the wafer 101 while the wafer 101 is rotated. Then, as shown in FIG. 13, the impurity ions of different doses are implanted to the first region 101-1 and the second region 101-2 of the wafer 101 divided by the circular border 101a. In particular, the first region 101-1 is more biased to the side opposite to the flat zone 101f of the wafer 101. If the first and second wide ion beams 302b-1 and 302b-2 have a lower dose than that of the third wide ion beam 302b-3, the concentration of the impurity ions is higher at the first region 101-1 than at the second region 101-2. If the first and second wide ion beams 302b-1 and 302b-2 have a higher dose than that of the third wide ion beam 302b-3, the concentration of the impurity ions is lower at the first region 101-1 than at the second region 101-2. As such, by suitably adjusting the initial position of the wafer in the negative Y (−Y) direction, it is possible to suitably bias the first region 101-1 of the wafer to the side opposite to the flat zone 101f of the wafer 101.

Figure 20:
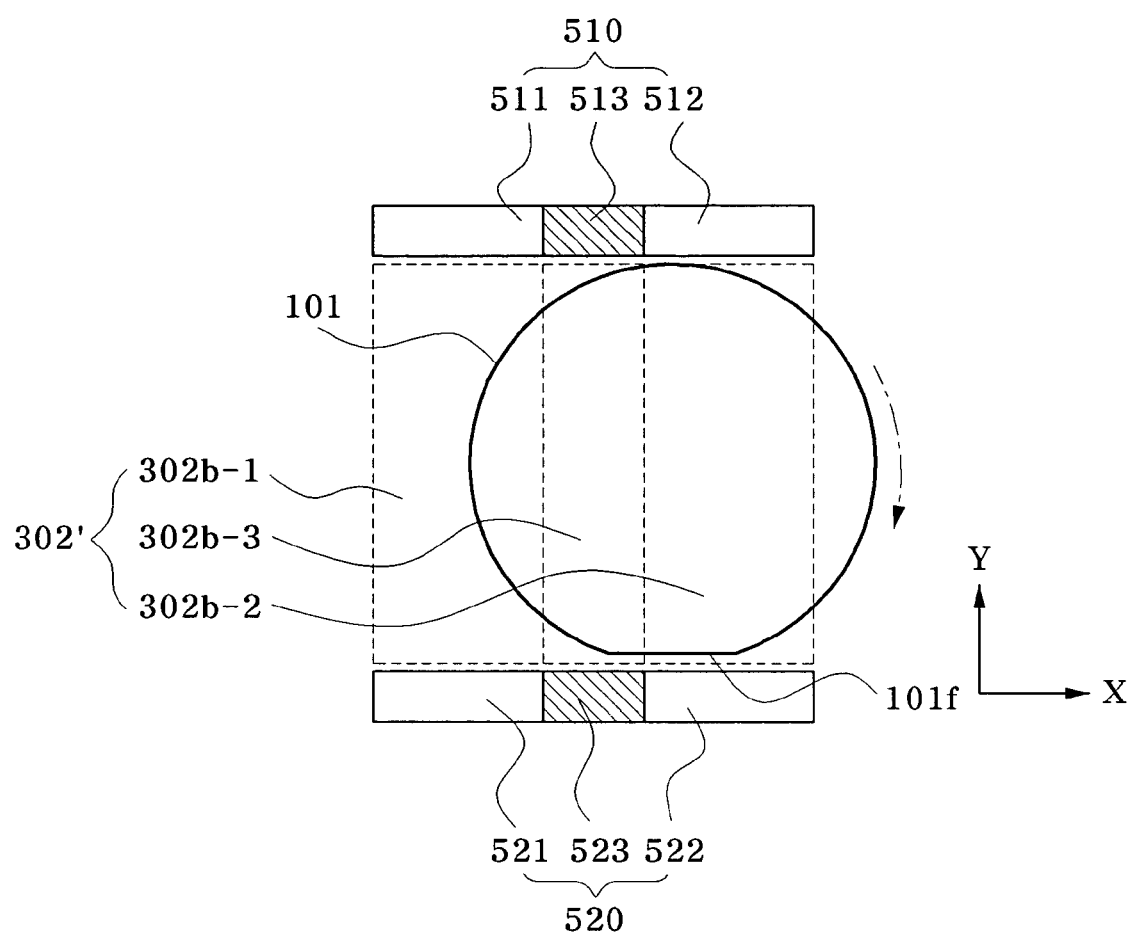

Next, referring to FIG. 20, this method is directed to biasing the first region 101-1 of the wafer 101 to the left side of the wafer as shown in FIG. 15, and more specifically, with a flat zone 101f of the wafer 101 located at a lower portion of the wafer, whereby the wafer 101 is moved a predetermined distance in the X direction. Then, some portion of a right region of the wafer 101 is not irradiated by the wide ion beams 302', so that this portion is not implanted with the impurity ions. A remaining region of the wafer 101 is irradiated by the wide ion beams 302', so that only this region is implanted with the impurity ions.

With the wafer 101 disposed between the upper and lower magnetrons such that the some portion of the right side of the wafer 101 is not irradiated by the wide ion beams 302', the wide ion beams 302' are irradiated to the wafer 101 while the wafer 101 is rotated. Then, as shown in FIG. 15, the impurity ions of different doses are implanted to the first region 101-1 and the second region 101-2 of the wafer 101 divided by the circular border 101a. Particularly, the first region 101-1 is more biased to the left side of the wafer 101. If the first and second wide ion beams 302b-1 and 302b-2 have a lower dose than that of the third wide ion beam 302b-3, the concentration of the impurity ions is higher at the first region 101-1 than at the second region 101-2. If the first and second wide ion beams 302b-1 and 302b-2 have a higher dose than that of the third wide ion beam 302b-3, the concentration of the impurity ions is lower at the first region 101-1 than at the second region 101-2. As such, by suitably adjusting the initial position of the wafer 101 in the X direction, it is possible to suitably bias the first region 101-1 of the wafer 101 to the left side of the wafer 101.

Figure 21:
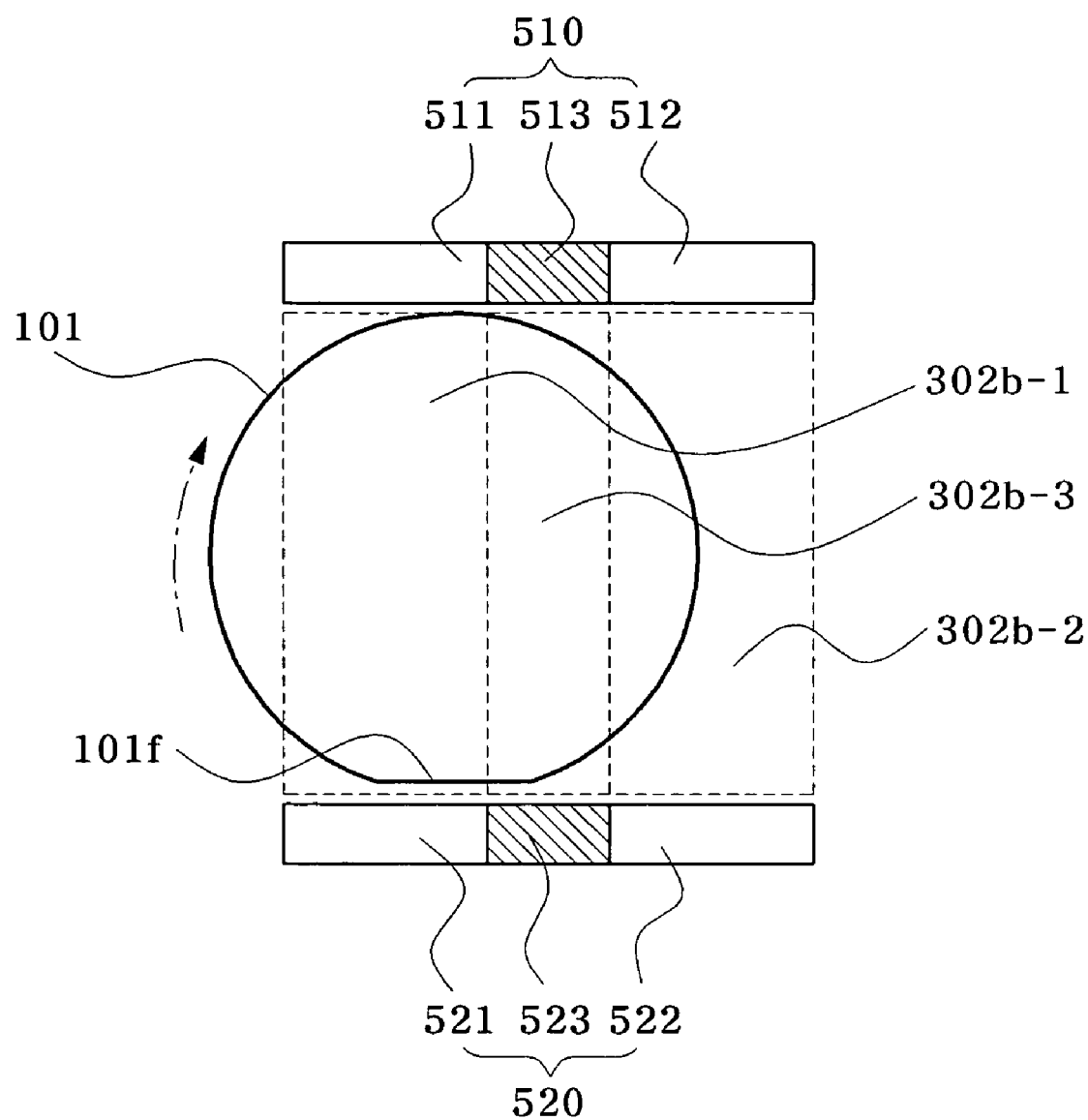

Next, referring to FIG. 21, this method is directed to biasing the first region 101-1 of the wafer 101 to the right side of the wafer as shown in FIG. 7, and more specifically, with a flat zone 101f of the wafer 101 located at the lower portion of the wafer, the wafer 101 is moved a predetermined distance in the −X direction. Then, some portion of a left region of the wafer 101 is not irradiated by the wide ion beams 302', so that this portion is not implanted with the impurity ions. The remaining region of the wafer 101 is irradiated by the wide ion beams 302', so that only this region is implanted with the impurity ions.

With the wafer 101 disposed between the upper and lower magnetrons such that some portion of the left side of the wafer 101 is not irradiated by the wide ion beams 302', the wide ion beams 302' are irradiated to the wafer 101 while the wafer 101 is rotated. Then, as shown in FIG. 17, the impurity ions of different doses are implanted to the first region 101-1 and the second region 101-2 of the wafer 101 divided by the circular border 101a. In particular, the first region 101-1 is more biased to the right side of the wafer 101. If the first and second wide ion beams 302b-1 and 302b-2 have a lower dose than that of the third wide ion beam 302b-3, the concentration of the impurity ions is higher at the first region 101-1 than at the second region 101-2. If the first and second wide ion beams 302b-1 and 302b-2 have a higher dose than that of the third wide ion beam 302b-3, the concentration of the impurity ions is lower at the first region 101-1 than at the second region 101-2. As such, by suitably adjusting the initial position of the wafer 101 in the −X direction, it is possible to suitably bias the first region 101-1 of the wafer 101 to the right side of the wafer 101.

Figure 22:
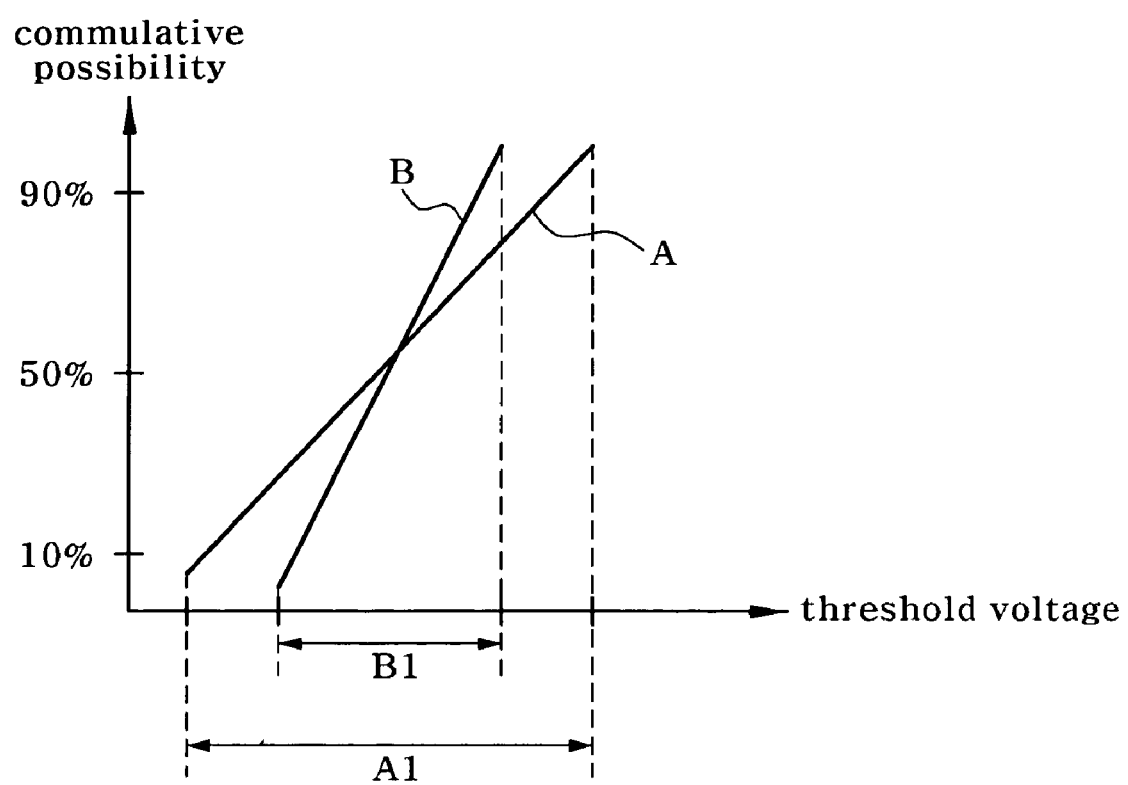
FIG. 22 is a graph depicting the cumulative possibility of a threshold voltage exhibited by conventional ion implantation methods, and a cumulative possibility of the threshold voltage exhibited by non-uniform ion implantation in accordance with an embodiment of present invention.

FIG. 22 is a graph depicting a cumulative possibility of a threshold voltage exhibited by conventional ion implantation methods, and a cumulative possibility of the threshold voltage exhibited by non-uniform ion implantation in accordance with the present invention.

As shown in FIG. 22, the cumulative possibility of the threshold voltage exhibited by the non-uniform ion implantation according to the invention is present in a narrower range B1 as shown by line B in FIG. 22, whereas the cumulative possibility of the threshold voltage exhibited by conventional ion implantation methods is present in a wider range A1 as shown by line A in FIG. 22. Accordingly, it can be appreciated from the graph that the non-uniformity of the threshold voltage is enhanced in the entire area of the wafer.

One of the advantageous effects of the present invention results in a smooth circular border formed between the regions to which the impurity ions are implanted with different concentrations because the wide ion beams of different doses are irradiated to a wafer while the wafer is rotated. In addition, since the position of the wafer is suitably changed for the wide ion beams, it is possible to suitably control the disposition of the regions implanted with the impurity ions of different concentrations.

It should be understood that the embodiments and the accompanying drawings have been described for illustrative purposes and the present invention is not limited by the following claims. Further, those skilled in the art will appreciate that various modifications, additions and substitutions are allowed without departing from the scope and spirit of the invention as set forth in the accompanying claims.

What is claimed is:

1. An ion implantation apparatus, comprising:
   a wide ion beam generator configured to generate a plurality of wide ion beams to irradiate a plurality of regions on a wafer, the plurality of wide ion beams including first and second wide ion beams, the plurality of regions including first and second regions; and
   a wafer rotating device configured to rotate the wafer in a predetermined direction while the wide ion beams generated by the wide ion beam generator are irradiated to the wafer.

2. The apparatus as set forth in claim 1, wherein the first wide ion beam has a different dose from that of the second wide ion beam.

3. A non-uniform ion implantation apparatus, comprising:
   a wide ion beam generator configured to generate a plurality of wide ion beams comprising first and second wide ion beams to irradiate first and second regions of a wafer, respectively; and
   a wafer rotating device configured to rotate the wafer in a predetermined direction while the wide ion beams generated by the wide ion beam generator are irradiated to the wafer.

4. The apparatus as set forth in claim 3, wherein the first and second wide ion beams have different doses.

5. The apparatus as set forth in claim 3, wherein the first and second regions together occupy half an area of the wafer.

6. The apparatus as set forth in claim 5, wherein the first and second regions are divided by a border in a vertical direction.

7. The apparatus as set forth in claim 6, wherein the first region is adjacent to a periphery of the wafer with respect to the border, and the second region is adjacent to a central region of the wafer with respect to the border.

8. The apparatus as set forth in claim 3, wherein the first and second regions together occupy an entire area of the wafer.

9. The apparatus as set forth in claim 8, wherein the first and second regions are divided by first and second borders in a vertical direction.

10. The apparatus as set forth in claim 9, wherein the first region is adjacent to a periphery of the wafer with respect to the first and second borders, and the second region is adjacent to a central region of the wafer with respect to the first and second borders.

11. A non-uniform ion implantation apparatus, comprising:
    a wide ion beam generator including a first and second magnetrons configured to generate wide ion beams to irradiate a region of a wafer between the first and second magnetrons, the first magnetron including a plurality of first unit magnetrons, the second magnetron including a plurality of second unit magnetrons, each group of the second unit magnetrons facing and being spaced a predetermined distance from each group of the first unit magnetrons; and
    a wafer rotating device configured to rotate the wafer in a predetermined direction while the wide ion beams generated by the wide ion beam generator are irradiated to the wafer.

12. The apparatus as set forth in claim 11, wherein the plurality of first unit magnetrons includes a first group of the first unit magnetrons to which a first bias is applied, and a second group of the first unit magnetrons to which a second bias different from the first bias is applied, and
    the plurality of second unit magnetron includes a first group of the second unit magnetrons to which the first bias is applied, and a second group of the second unit magnetrons to which the second bias different from the first bias is applied.

13. The apparatus as set forth in claim 12, wherein the first group of the first unit magnetrons faces the first group of the second unit magnetrons, such that a first wide ion beam having a first dose is generated between the first group of first unit magnetrons and the first group of second unit magnetrons, and
    the second group of the first unit magnetrons faces the second group of the second unit magnetrons such that a second wide ion beam having a second dose different from the first dose is generated between the second group of first unit magnetrons and the second group of second unit magnetrons.

14. The apparatus as set forth in claim 11, wherein the first unit magnetrons includes first and second groups of the first unit magnetrons separated from each other, to which a first bias is applied, and a third group of the first unit magnetrons disposed between the first and second groups of the first unit magnetrons, to which a second bias different from the first bias is applied.

15. The apparatus as set forth in claim 14, wherein the first and second groups of the first unit magnetrons respectively face the first and second groups of the second unit magnetrons such that a first wide ion beam having a first dose is respectively generated between the first and second groups of the first unit magnetrons and the first and second groups of the second unit magnetrons, and
    the third group of first unit magnetrons faces the third group of the second unit magnetrons, such that a second wide ion beam having a second dose different from the first dose is generated between the third group of the first unit magnetrons and the third group of the second unit magnetrons.

* * * * *